(12) United States Patent  (10) Patent No.: US 7,675,427 B2
Deaver, Sr. et al.  (45) Date of Patent: Mar. 9, 2010

(54) SYSTEM AND METHOD FOR DETERMINING DISTRIBUTION TRANSFORMER EFFICIENCY

(75) Inventors: Brian J. Deaver, Sr., Fallston, MD (US); William O. Radtke, Ellicott City, MD (US)

(73) Assignee: Current Technologies, LLC, Germantown, MD (US)

( * ) Notice: Subject to any disclaimer, the term of this patent is extended or adjusted under 35 U.S.C. 154(b) by 294 days.

(21) Appl. No.: 11/775,205

(22) Filed: Jul. 9, 2007

(65) Prior Publication Data

US 2008/0106426 A1 May 8, 2008

Related U.S. Application Data

(63) Continuation-in-part of application No. 11/555,740, filed on Nov. 2, 2006.

(51) Int. Cl.
*G08B 21/00* (2006.01)
(52) U.S. Cl. .................................... 340/661; 340/646
(58) Field of Classification Search ............... 340/661, 340/646
See application file for complete search history.

(56) References Cited

U.S. PATENT DOCUMENTS

| | | | |
|---|---|---|---|
| 1,790,024 A | 1/1931 | Rump | |
| 4,419,619 A | 12/1983 | Jindrick et al. | |
| 4,475,047 A * | 10/1984 | Ebert, Jr. .................... | 307/66 |
| 4,654,806 A | 3/1987 | Poyser et al. | |
| 4,823,280 A * | 4/1989 | Mailandt et al. ............ | 340/552 |
| 5,760,492 A | 6/1998 | Kanoi et al. | |
| 6,112,136 A * | 8/2000 | Paul et al. ................... | 700/293 |
| 6,445,196 B1 | 9/2002 | White | |
| 6,549,120 B1 | 4/2003 | De Buda | |
| 6,711,512 B2 | 3/2004 | Noh | |
| 6,906,630 B2 | 6/2005 | Georges et al. | |
| 7,089,125 B2 | 8/2006 | Sonderegger | |
| 7,323,852 B2 * | 1/2008 | Hoffman ..................... | 323/258 |
| 2002/0161558 A1 | 10/2002 | Georges et al. | |
| 2005/0096772 A1 | 5/2005 | Cox et al. | |
| 2005/0223782 A1 | 10/2005 | Dohi et al. | |
| 2006/0033454 A1 | 2/2006 | Mathews et al. | |
| 2006/0106554 A1 | 5/2006 | Borkowski et al. | |

(Continued)

OTHER PUBLICATIONS

"International Search Report", *International Search Report* Dated May 7, 2008, PCT/US07/82763, (May 7, 2008).

(Continued)

*Primary Examiner*—Eric M Blount
(74) *Attorney, Agent, or Firm*—Mel Barnes; Capital Legal Group, LLC

(57) ABSTRACT

A system, device and method of determining an efficiency of a distribution transformer that receives power from a medium voltage power line and that provides power to a plurality of customer premises via a low voltage subnet is provided. In one embodiment, the method includes determining an input power to the transformer from the medium voltage power line, determining an output power from the transformer, determining a transformer efficiency based on the input power and the output power, comparing the transformer efficiency with a threshold efficiency, and providing a notification when the transformer efficiency is below a threshold efficiency. Determining the input power may include measuring the current input and estimating the voltage input based on a voltage measure of the low voltage subnet and the turns ratio of the transformer.

45 Claims, 10 Drawing Sheets

U.S. PATENT DOCUMENTS

| | | |
|---|---|---|
| 2006/0201264 A1 | 9/2006 | Dohi et al. |
| 2006/0251147 A1 | 11/2006 | Balan |
| 2007/0014062 A1 | 1/2007 | Fischer |
| 2007/0052426 A1 | 3/2007 | Wells et al. |
| 2007/0108986 A1 | 5/2007 | Moore et al. |
| 2007/0171958 A1 | 7/2007 | Hoang et al. |
| 2007/0200553 A1 | 8/2007 | Morrison |
| 2008/0106425 A1 | 5/2008 | Deaver et al. |

OTHER PUBLICATIONS

"Written Opinion", *Written Opinion* Dated May 7, 2008, PCT/US07/82763, (May 7, 2008).

* cited by examiner

SYSTEM AND METHOD FOR DETERMINING DISTRIBUTION TRANSFORMER EFFICIENCY

CROSS REFERENCE TO RELATED APPLICATIONS

This application is a continuation-in-part of, and claims priority to, U.S. patent application Ser. No. 11/555,740 filed Nov. 2, 2006, which is incorporated herein by reference in its entirety.

FIELD OF THE INVENTION

The present invention generally relates to methods and apparatus for monitoring power distribution parameters, and more particularly to methods and apparatus for determining the efficiency of operating distribution transformers.

BACKGROUND OF THE INVENTION

Distribution transformers are parts of the power system infrastructure. The power system infrastructure includes power lines, transformers and other devices for power generation, power transmission, and power delivery. A power source generates power, which is transmitted along high voltage (HV) power lines for long distances. Typical voltages found on HV transmission lines range from 69 kilovolts (kV) to in excess of 800 kV. The power signals are stepped down to medium voltage (MV) power signals at regional substation transformers. MV power lines carry power signals through neighborhoods and populated areas. Typical voltages found on MV power lines power can be from about 1000 V to about 100 kV. The MV voltages are stepped down further to low voltage (LV) levels by distribution transformers. A low voltage subnet (as used herein) comprises the LV power lines connected to the distribution transformer and that carry power to the customer premises. The LV power lines have voltages ranging from about 100 V to about 600 V, and in the United States, typically about 120 volts (referenced to ground).

In the United States local distribution transformers typically feed anywhere from one to ten homes, depending upon the concentration of the customer premises in a particular area. A power distribution system for a given area may include many distribution transformers and thousands of distribution transformers may be located within a city or region. Thus, distribution transformers represent a significant capital investment. Some utilities spend a significant percentage of total distribution capital spending in one year on new distribution transformers.

The total cost of owning a distribution transformer (hereinafter "owning cost) to a utility includes the cost of the transformer, (e.g., purchase price, installation cost, residual end of life cost, interest, depreciation, taxes), the cost of energy consumed by transformer losses, and the cost of the system capacity required to accommodate such losses. In the past the useful life of a distribution transformer has been approximately twenty years. Consequently, even small decreases in efficiency may result in power losses (to the utility) that result in a substantial financial impact (e.g., owning cost) when such losses occur over many years of operation. In addition, such losses cause the utility to generate more power than otherwise would be necessary, thereby negatively impacting the environment. When such losses occur for many transformers over many years, a utility also may make capital expenditures to increase system capacity that may not have been necessary but for the inefficiencies. Accordingly, inefficient distribution transformers may result in increased costs associated with the cost of power losses and capital expenditures as well as negatively impact the environment.

On challenge to utilities is that utilities cannot readily identify inefficient transformers. The Distribution Systems Testing, Application, and Research (DSTAR) utility consortium commissioned the development of the Transformer Owning Cost Software (TOCS) tool for analyzing and comparing the total owning cost of distribution transformers. TOCS is a tool for performing detailed analysis on different distribution transformer designs and loading characteristics. A batch analysis functionality within TOCS enables users to run multiple loading scenarios against a set of transformers and predict an estimated annualized owning cost. However, this software provides an estimate. Conventionally there has been no way of specifically determining the efficiency of an installed distribution transformer on a continuous ongoing basis during normal operation. In the past a utility crew may have measured the efficiency of a distribution transformer during a routine maintenance procedure. However, sending a crew to measure the efficiency of the multitude of distribution transformers residing in a large geographical area, such as a city, county, or state, would be cost prohibitive. In addition, measurements taken by a crew provide a "snap shot" of the transformer's efficiency under the then present conditions (e.g., at that temperature and with the existing load). Consequently, if the transformer's efficiency were to change (e.g., due to aging, change in temperature, change in load, etc.), the snap shot provided by a crew may be inaccurate, or worse, may have been misleading. Accordingly, there is a need for determining the efficiency of an operating distribution transformer in a cost effective, reliable, and accurate manner.

SUMMARY OF THE INVENTION

The present invention provides a system, device and method of determining efficiency of a distribution transformer that receives power from a medium voltage power line and that provides power to a plurality of customer premises via a low voltage subnet. In one embodiment, the method includes determining an input power to the transformer from the medium voltage power line, determining an output power from the transformer, determining a transformer efficiency based on the input power and the output power, comparing the transformer efficiency with a threshold efficiency, and providing a notification when the transformer efficiency is below a threshold efficiency. Determining the input power may include measuring the current input and estimating the voltage input based on a voltage measure of the low voltage subnet and the turns ratio of the transformer.

The invention will be better understood by reference to the following detailed description taken in conjunction with the accompanying drawings.

BRIEF DESCRIPTION OF THE DRAWINGS

The invention is further described in the detailed description that follows, by reference to the noted drawings by way of non-limiting illustrative embodiments of the invention, in which like reference numerals represent similar parts throughout the drawings. As should be understood, however, the invention is not limited to the precise arrangements and instrumentalities shown. In the drawings.

DETAILED DESCRIPTION OF ILLUSTRATIVE EMBODIMENTS

Figure 1:
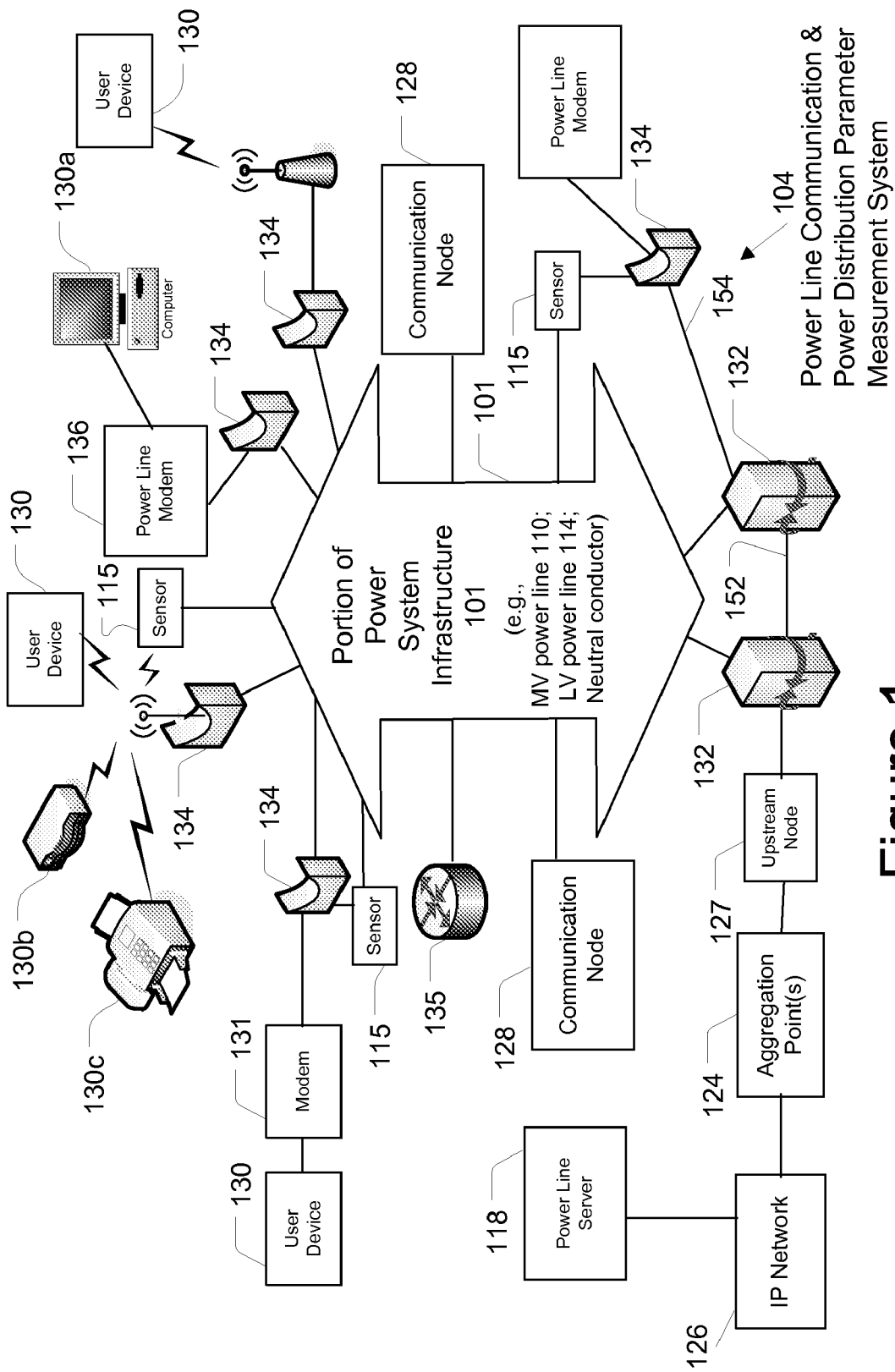
FIG. 1 is a block diagram of an example power line communication and power distribution parameter measurement system.

In the following description, for purposes of explanation and not limitation, specific details are set forth, such as particular networks, communication systems, computers, terminals, devices, components, techniques, data and network protocols, power line communication systems (PLCSs), software products and systems, enterprise applications, operating systems, development interfaces, hardware, etc. in order to provide a thorough understanding of the present invention.

However, it will be apparent to one skilled in the art that the present invention may be practiced in other embodiments that depart from these specific details. Detailed descriptions of well-known networks, communication systems, computers, terminals, devices, PLCSs, components, techniques, data and network protocols, software products and systems, operating systems, development interfaces, and hardware are omitted so as not to obscure the description of the present invention.

According to an embodiment of the present invention, a power line communication and power distribution parameter measurement system may determine distribution transformer efficiency on a continuing or intermittent basis. The measured efficiency may transmitted to a remote computer system for processing (e.g., to determine if the efficiency is below a threshold) or may be processed by the local device and a notification provided if the transformer's efficiency falls below a threshold efficiency. Highly efficient distribution transformers are desired so that more power can be delivered to the consumer at less cost to the utility. The efficiency may be reduced for a number of reasons. In some instances, the transformer may be installed incorrectly, or may be installed to operate less than optimally. In other instances the efficiency may be reduced due to harmonics or overload conditions. In addition, the efficiency may drop due to damage or deterioration.

Adverse efficiency factors may include design weaknesses, abnormal system conditions, aging conditions, pre-existing faults and timescales for fault development. Eventually a transformer may fail. The most common cause of a transformer failure is a breakdown of the insulation. Anything that adversely affects the insulating properties inside the transformer may reduce transformer life. For example, overload conditions or other causes of decreased efficiency may cause the transformer windings to operate at a higher temperature, which in turn may cause a gradual deterioration in the transformer insulation. Ultimately a transformer in the weakened insulation condition may fail, for example, as a result of shorted windings.

Insulation aging is a thermo-chemical process in which insulation degradation progresses at a highly nonlinear function of the temperature. Transformer temperature, in turn, is related to loading. However, the long thermal time constants of a transformer make the relationship between load and transformer temperature highly dynamic. This means that the temperature is dependent not only on the present load, but also on the loading in previous hours. In addition, the ambient temperature plays an additive role to the effects of loading.

Most distribution transformers in a power distribution network are paper/oil insulated. In addition to the stresses caused by persistent operating voltage, the insulations get ages due to high temperatures caused by load and fault currents, humidity and mechanical stresses caused, for example, by fault currents. Small discharges in the insulations weaken the paper insulations and dissolve gases in oil. The condition of the paper insulations can be detected, for example, with furfural analysis. There are also other methods like partial discharge measurements, infra red emission tests and acoustic emission tests. However, instead of, or in addition to, time-consuming costly spot checks for estimating the transformer life, the efficiency of the transformer may be determined in a more economical, effective and reliable manner using the system and method embodiments of the present invention.

In particular, both the power supplied to a distribution transformer and the power output from the same distribution transformer may be monitored on a continuous, regular, or intermittent basis. Differences between the monitored input and output power correspond to transformer losses or are proportional to the transformer's efficiency. Such losses may be no-load losses or load losses. No-load losses are core losses incurred while the transformer is energized, regardless of loading. Load losses are coil losses proportional to the square of load current. With sufficient monitoring the specific loss types may be calculated.

Following is a description of an example power line communication and power distribution parameter measurement system that may be used to practice the present invention. A detailed description of methods for detecting distribution transformer efficiency according to example embodiments of the present invention follows thereafter.

Communication and Measurement System

FIG. 1 shows a power line communication and power distribution parameter measurement system 104 for detecting distribution transformer efficiency according to an embodiment of the present invention. Power distribution parameter data, including transformer efficiency, may be gathered from multiple points along a power distribution network, and transmitted to a utility or other processing center. For example, sensor devices 115 may be positioned along overhead and underground medium voltage power lines, and along network (external or internal) low voltage power lines, which may be above ground or underground.

The power line communication and distribution parameter measurement system 104 also may provide user services and communication services to devices accessing the system. Exemplary services that may be provided include high speed broadband internet access, mobile telephone communications, broadband communications, VoIP, streaming video and audio services, and other communication services. Such services may be provided to homes, buildings and other structures, and to each room, office, apartment, or other unit or sub-unit of multi-unit structures. Communication services also may be provided to mobile and stationary devices in outdoor areas such as customer premises yards, parks, stadiums, and also to public and semi-public indoor areas such as subway trains, subway stations, train stations, airports, restaurants, public and private automobiles, bodies of water (e.g., rivers, bays, inlets, etc.), building lobbies, elevators, etc.

The power line communication and power distribution parameter measurement system 104 includes a plurality of communication nodes 128 which form communication links using power lines 110, 114 and other communication media. One type of communication node 128 may be a backhaul node 132. Another type of communication node 128 may be an access node 134. Another type of communication node 128 may be a repeater node 135. A given node 128 may serve as a backhaul node 132, access node 134, and/or repeater node 135.

A communication link is formed between two communication nodes 128 over a communication medium. Some links may be formed over MV power lines 110. Some links may be formed over LV power lines 114. Other links may be gigabit-Ethernet links 152, 154 formed, for example, using a fiber optic cable. Thus, some links may be formed using a portion 101 of the power system infrastructure, while other links may be formed over another communication media, (e.g., a coaxial cable, a T-1 line, a fiber optic cable, wirelessly (e.g., IEEE 802.11a/b/g, 802.16, 1G, 2G, 3G, or satellite such as WildBlue®)). The links formed by wired or wireless media may occur at any point along a communication path between a backhaul node 132 and a user device 130.

Each communication node 128 may be formed by one or more communication devices. Communication nodes which communicate over a power line medium include a power line communication device. Exemplary power line communication devices include a backhaul device 138 (see FIG. 6), an access device 139 (see FIG. 8), and a repeater 135. Communication nodes communicate via a wireless link may include a wireless access point having at least a wireless transceiver, which may comprise mobile telephone cell site/transceiver (e.g., a micro or pico cell site) or an IEEE 802.11 transceiver (Wifi). Communication nodes which communicate via a coaxial cable may include a cable modem. Communication nodes which communicate via a twisted pair may include a DSL modem. A given communication node typically will communicate in both directions (either full duplex or half duplex) of its link, which may be over the same or different types of communication media. Accordingly, a communication node 128 may include one, two or more communication devices, which may communicate along the same or different types of communication media.

A backhaul node 132 may serve as an interface between a power line medium (e.g., an MV power line 110) of the system 104 and an upstream node 127, which may be, for example, connected to an aggregation point 124 that may provide a connection to an IP network 126. The system 104 typically includes one or more backhaul nodes 132. Upstream communications from user premises and control and monitoring communications from power line communication devices may be communicated to an access node 134, to a backhaul node 132, and then transmitted to an aggregation point 124 which is communicatively coupled to the IP network 126. Communications may traverse the IP network to a destination, such as a web server, power line server 118, or an end user device. The backhaul node 132 may be coupled to the aggregation point 124 directly or indirectly (i.e., via one or more intermediate nodes 127). The backhaul node 132 may communicate with its upstream device via any of several alternative communication media, such as a fiber optic cable (digital or analog (e.g., Wave Division Multiplexed)), coaxial cable, WiMAX, IEEE 802.11, twisted pair and/or another wired or wireless media. Downstream communications from the IP network 126 typically are communicated through the aggregation point 124 to the backhaul node 132. The aggregation point 124 typically includes an Internet Protocol (IP) network data packet router and is connected to an IP network backbone, thereby providing access to an IP network 126 (i.e., can be connected to or form part of a point of presence or POP). Any available mechanism may be used to link the aggregation point 124 to the POP or other device (e.g., fiber optic conductors, T-carrier, Synchronous Optical Network (SONET), and wireless techniques).

An access node 134 may transmit data to and receive data from, one or more user devices 130 or other network destinations. Other data, such as power line parameter data (e.g., current data as measured by a power line current sensor device) may be received by an access node's power line communication device 139. The data enters the network 104 along a communication medium coupled to the access node 134. The data is routed through the network 104 to a backhaul node 132. Downstream data is sent through the network 104 to a user device 130. Exemplary user devices 130 include a computer 130a, LAN, a WLAN, router 130b, Voice-over IP endpoint, game system, personal digital assistant (PDA), mobile telephone, digital cable box, security system, alarm system (e.g., fire, smoke, carbon dioxide, security/burglar, etc.), stereo system, television, fax machine 130c, HomePlug residential network, or other user device having a data interface. The system also may be used to communicate utility usage data from automated gas, water, and/or electric power meters. A user device 130 may include or be coupled to a modem to communicate with a given access node 134. Exemplary modems include a power line modem 136, a wireless modem 131, a cable modem, a DSL modem or other suitable modem or transceiver for communicating with its access node.

A repeater node 135 may receive and re-transmit data (i.e., repeat), for example, to extend the communications range of other communication elements. As a communication traverses the communication network 104, backhaul nodes 132 and access nodes 134 also may serve as repeater nodes 135, (e.g., for other access nodes and other backhaul nodes 132). Repeaters may also be stand-alone devices without additional functionality. Repeaters 135 may be coupled to and repeat data on MV power lines or LV power lines (and, for the latter, be coupled to the internal or external LV power lines).

Various user devices 130 and power line communication devices (PLCD) may transmit and receive data over the communication links to communicate via an IP network 126 (e.g., the Internet). Communications may include measurement data of power distribution parameters, control data and user data. For example, power line parameter data and control data may be communicated to a power line server 118 for processing. A power line parameter sensor device 115 may be located in the vicinity of, and communicatively coupled to, a power line communication device 134, 135, 132 (referred to herein as PLCD 137 for brevity and to mean any of power line communication devices 134, 135, or 132) to measure or detect power line parameter data.

Power Distribution Parameter Sensor Device:

In some embodiments, a power line parameter sensor device 115 may be installed at each communication node 128 to measure power line parameters of various regions, neighborhoods and structures. The power line distribution parameter sensor device 115 may measure or detect a power distribution parameter, such as distribution transformer load, power usage, power line voltage, and power line current, power (or current) input and/or power (or current) output. Other data also may be measured (or detected) such as detection of a power outage, detection of water in a pad mount transformer enclosure, detection of an open pad mount transformer enclosure, detection of a street light failure, and measurement of power delivered to a transformer (e.g., the sensor device may be coupled to a conductor that connects the distribution transformer to the MV power line). Still other data may be measured or detected such as power factor data (e.g., the phase angle between the voltage and current of a power line), which may be determined by processing data from multiple sensor devices (i.e., current and voltage). Still other data may be measured or detected such as power delivered to a downstream branch, data of the harmonic components of a power signal, and load transients data. One skilled in the art will appreciate that still other types of parameter data also may be measured and detected via one sensor device, multiple sensor devices (e.g., forming one or multiple assemblies), or multiple distributed sensors. The power distribution parameter may be measured by the power line communication device and communicated to a power line server 118, or other power line distribution management system and/or power line communication management system.

One sensor device 115 may be configured to provide data of more than one parameter. For example, a sensor device 115 may be configured to measure the voltage and current carried by the power line (and therefore have multiple sensors). One or more sensor devices 115 may be installed at a given power line 110 and/or 114 and be coupled to a corresponding power line communication device 137. For example, a power line current sensor device may be installed at power lines 110 and 114 alone or with another power line parameter sensor device (e.g., a power line voltage sensor device). Such a configuration may be used to determine the current into, and voltage at an output of a transformer. In addition, the data provided by the sensor device 115 may be used to determine additional parameters (either by the sensor device 115, the power line communication device 137, or a remote computer). For example, a sensor device 115 may be configured to measure the instantaneous voltage and current (e.g., over brief time period). The measurement data may be provided to the power line communication device 137 for processing. With adequate voltage and current sampling, the device 133 may compute the power factor of the power line (through means well known in the art). Thus, other power line parameters may be measured using an appropriate sensor device coupled to a power line 110, 114 in the vicinity of a power line communication device 137 in place of, or in addition to, the power line current sensor device.

In an example embodiment, the sensor device may comprise a power line current sensor device that is formed of a Rogowski coil and such sensor device may be installed throughout a network (on both MV and LV power lines). The Rogowski coil is an electrical device for measuring alternating current (AC) or high speed current pulses. An exemplary embodiment includes a first and second helical coils of wire (loops) electrically connected in series with each other. The first loop is wound with a substantially constant winding density in a first direction around a core that has a substantially constant cross section. The second loop is wound with a substantially constant winding density in a second direction around a core that has a substantially constant cross section. A conductor (e.g., a power line) whose current is to be measured traverses through the loops. A voltage may be induced in the coil based on the rate of change of the current running through the power line. Rogowski coils may have other configurations as well.

One advantage of a Rogowski coil is that it may be open-ended and flexible, allowing it to be wrapped around an energized conductor. Also, a Rogowski coil may include an air core (or other dielectric core) rather than an iron core, which gives the coil a low inductance and an ability to respond to fast-changing currents. Further, the Rogowski coil typically is highly linear, even when subjected to large currents, such as those of low voltage and medium voltage power lines. By forming the Rogowski coil with equally spaced windings, effects of electromagnetic interference may be substantially avoided. On method of providing equal spaced windings is to use printed circuit boards to manufacture the coil. Some examples of a Rogowski coil are described in U.S. Pat. No. 6,313,623 issued on Nov. 6, 2001 for "High Precision Rogowski Coil," which is incorporated herein by reference in its entirety.

Figure 2:
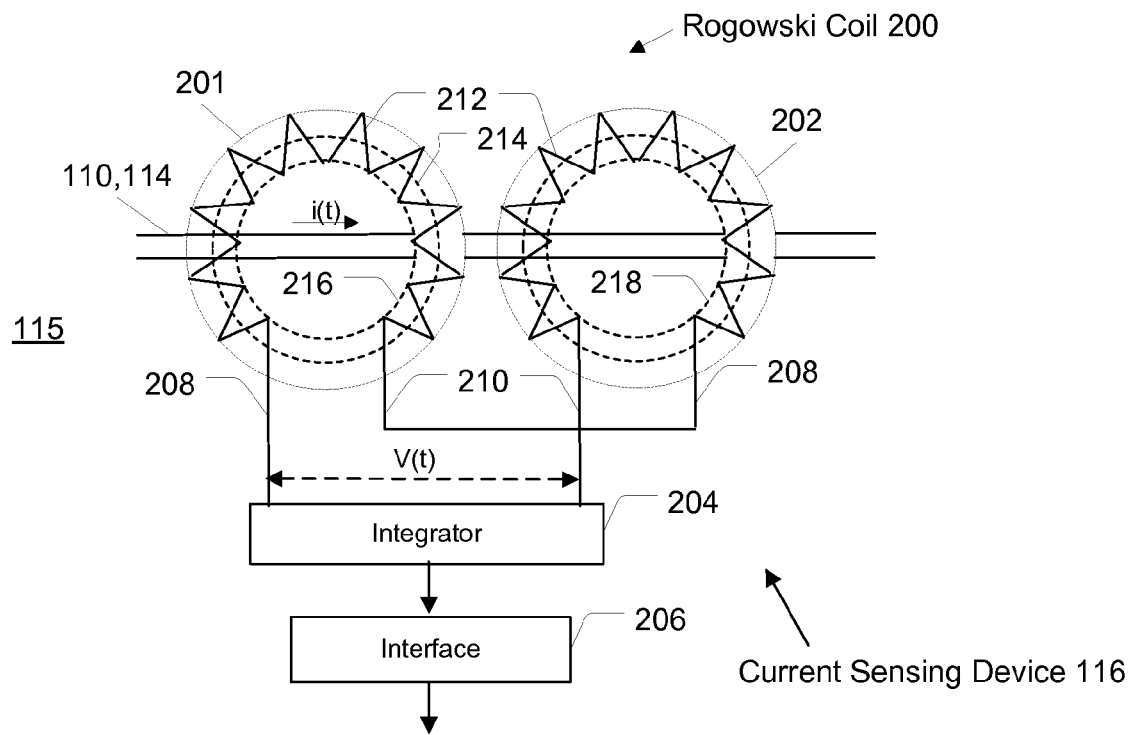
FIG. 2 is a block diagram and partial schematic of an example embodiment of a power line current sensor device.

FIG. 2 shows one example embodiment of a power line parameter sensor device 115, which comprises a power line current sensor device 116 including a Rogowski coil 200 having two loops 201, 202, an integrator 204 and an interface 206. Each loop 201, 202 has a first end 208 and a second end 210. By shaping the loops 201, 202 to bring the two ends 208, 210 toward each other, while leaving space between the ends 208, 210, the Rogowski coil 200 may be readily installed at a power line 110, 114. The coil 200 may have a generally circular shape with an open arc between the ends 208, 210 (to be slipped around the power line) or may be substantially a full closed circle (and formed in two pieces that are hinged together to clamp over the power line). One of ordinary skill in the art will appreciate that other shapes may be implemented. In this example embodiment, to install the current sensor device 116, the two pieces of the loops 201, 202 are clamped around the power line 110, 114 (which may require pulling back the power line neutral conductor for underground power lines). A power line 110, 114 passes through the circular shape as shown. An advantage of these configurations is that the power line 110, 114 may not need to be disconnected (in many instances) to install the current sensor device 116.

The coil 200 of the Rogowski coil may include a first winding 201 wound in a first direction, a second winding 202 wound in a second direction, and wherein said first winding 201 and said second winding 202 each include traces on a printed circuit board. In some embodiments the windings 201, 202 are traced on one or more printed circuit boards (PCBs) 216, 218, and then the printed circuit boards (if more than one) are coupled together to form a monolithic PCB assembly (i.e., one structure). In another embodiment, the two windings of the coil are traced together and interwoven with each other on the PCB (a multi-layer printed circuit board) and therefore may be referred to as being "coupled" together. Because the windings are traced within each other (that is, the loops are interwoven), the loops are not identical in form. In another embodiment, the windings may be traced separately on separate PCBs and have identical geometries on separate PCBs, and be positioned along the power line 110, 114 in close proximity.

As alternating current flows through the power line 110, 114, a magnetic field is generated inducing an electrical field (i.e. voltage) within each winding 201, 202 of the Rogowski coil 200. However, other sources of electromagnetic interference also may induce current flow in the windings 201, 202. By including a left-hand winding 201 and a right-hand winding 202 (i.e., windings in substantially opposite directions) with equally spaced windings, the effects from external sources are largely cancelled out. In particular, external fields from sources outside the Rogowski coil 200, such as other power lines or power line communication and distribution equipment, generate equal but opposite electrical flow in the windings 201, 202. The Rogowski coil 200 provides an instantaneous voltage measurement that is related to the alternating current (AC) flowing through the power line 110, 114.

Each winding 201, 202 of the Rogowski coil 200 comprises an electrical conductor 212 wound around a dielectric core 214 (e.g., PCB). In an example embodiment each loop 201, 202 has windings that are wound with a substantially constant density and a core 214 that has a magnetic permeability that may be equal to the permeability of free space $\mu_o$ (such as, for example, air) or a printed circuit board. In addition, the cross section of the core 214 may be substantially constant.

To obtain an expression for the voltage that is proportional to the current flowing through the power line 110, 114, the coil output voltage, v(t), may be integrated. For example, the integrator 204 may convert the measured voltage v(t) into a value equating to measured current. In example embodiments, the integrator 204 may comprise a resistor-capacitor (RC) integrator, an operational amplifier integrator, a digital filter (integrator), another circuit or a processor. Observing that the voltage v(t), is proportional to the derivative of the current being measured, and that if that current is sinusoidal, the voltage v(t) will also be sinusoidal. Thus, determining the current does not always require integration of the voltage v(t)), in which embodiment the integrator 204 may be omitted.

Referring to FIGS. 2-5, each power line distribution parameter sensor device 115 may include an interface 206 which provides communications with a power line communication device 137, such as a backhaul device 138, an access device 139, a repeater 135, or other communication device. In various embodiments different interfaces 206 may be implemented. In some embodiments the sensor device 115 may include an analog to digital converter (ADC). In other embodiments, raw analog data is communicated from the sensor device 115 to the power line communication device, which may convert the analog data to digital data (via an ADC) and provide processing. Such processing may include, for example, time stamping, formatting the data, normalizing the data, converting the data (e.g., converting the voltage measured by the ADC to a current value), removing an offset, and other such data processing. The processing also may be performed in the sensor device 115, in the power line communication device. Thus, the sensor device 115 of some embodiments may include a controller, an analog to digital converter (ADC), and a memory coupled to said ADC (perhaps via a controller) and configured to store current data. Alternately, the data may be transmitted to the power line server 118 or another remote computer for processing.

The overhead medium voltage power lines typically are not insulated. Thus, for sensor devices 115 which contact (e.g., are to be clamped around for a Rogowski coil) an overhead medium voltage power line or other high voltage conductor, it may be necessary to isolate the voltage (which may be 5,000-10,000 volts or more) of the power line (to which the power line parameter sensor device 116 is mounted) from the power line communication device 137 and other power line devices not in contact with the MV power line. The communication path of the measured data may comprise a non-conductive communication link that allows the data to be communicated but that does not conduct the high voltages of the MV or other power lines. For power line parameter sensor devices 115 which are clamped around an underground power line, isolation may not be necessary because underground power lines are insulated and, therefore the sensor devices 115 do not come into contact with the medium voltage.

Figure 3:
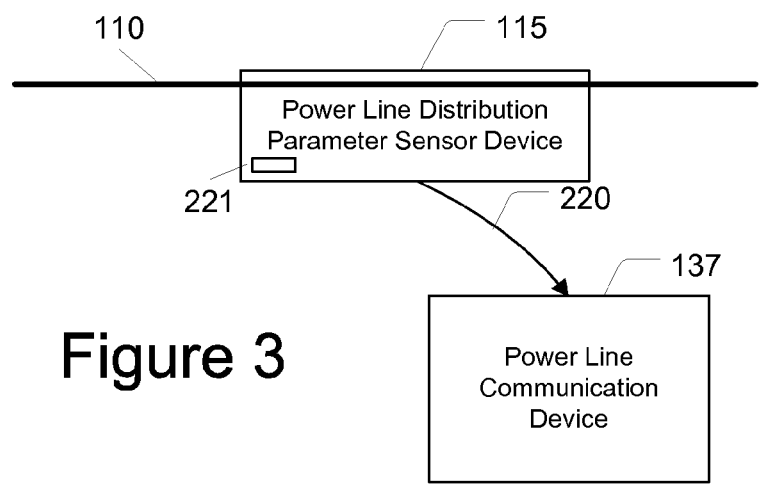
FIG. 3 is a block diagram of a power line parameter sensor device coupled to a power line communication device.
Figure 4:
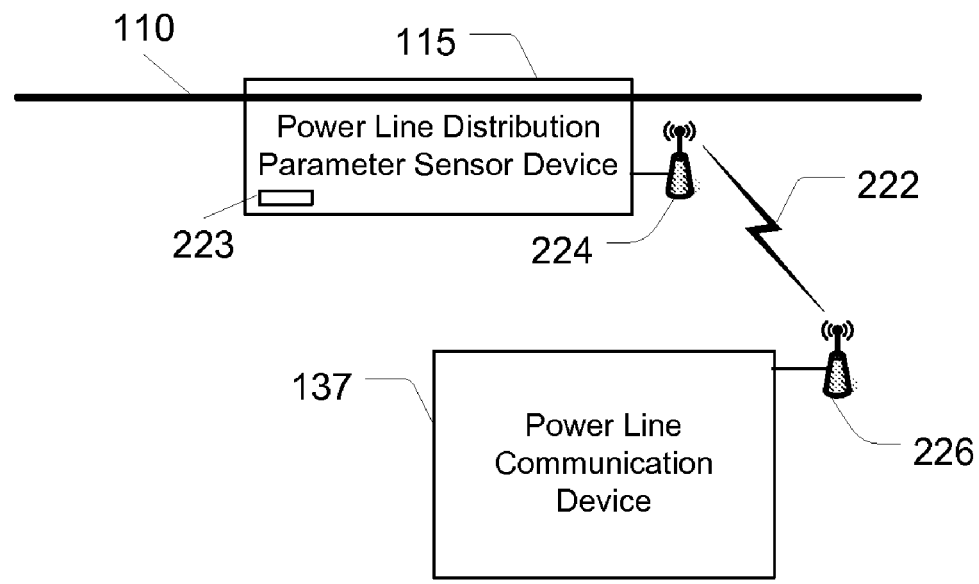
FIG. 4 is a block diagram of a power line parameter sensor device coupled to a power line communication device by a wireless medium.
Figure 5:
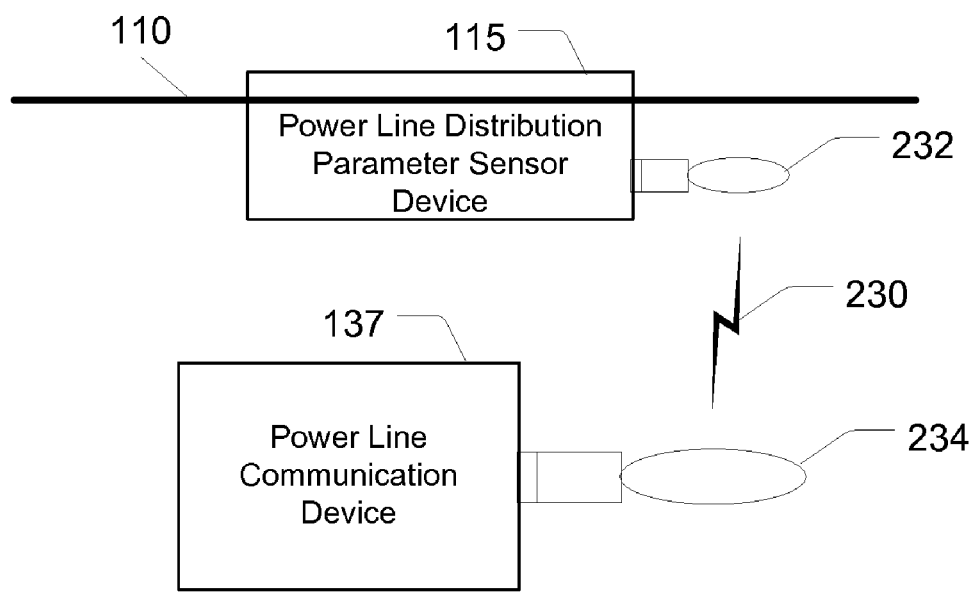
FIG. 5 is a block diagram of a power line parameter sensor device coupled to a power line communication device by a wireless medium.

FIGS. 3, 4 and 5 show different manners of coupling the power line parameter sensor device 115 to the power line communication device 138, 139, 135, via a non-conductive communication link to provide electrical isolation (when necessary) from the medium voltage power line 110. In FIG. 3, a wired medium 220 carries measurement data from the power line parameter sensor device 115 to the power line communication device 138, 139, 135. For underground insulated MV power lines and for low voltage power lines (which are also usually insulated), the wired medium 220 may comprise a conductive wire (i.e., a pair or wires). For overhead un-insulated MV power lines, however, the wired medium 220 may include a fiber optic cable or other wired medium that does not conduct high voltages. In such embodiment the power line parameter sensor device 115 and power line communication device 137 each may include a fiber optic transceiver (or fiber optic transmitter in the sensor device 115 and an optic receiver in the communication device). The fiber optic cable may carry analog or digitized sensor data to the power line communication device 137.

In some embodiments, the sensor device 115 may require a power source (i.e., an energy harvesting system) for powering the fiber optic transceiver and other components (such as an ADC) of the sensor device 115. Power may be sent over a fiber optic cable as an optical signal from the power line communication device 137 (or another device) to the sensor device 115. At the sensor device 115, the photonic energy is converted to electrical energy to power the fiber optic transmitter (that may form part of a transceiver) and other sensor device 115 components via a power supply 221. In other words, a photonic power delivery system may be used whereby light from a laser source illuminates a highly efficient photovoltaic power converter at the sensor device 115 to produce electrical power. An example embodiment of a photonic power supply system and method is described in U.S. Pat. No. 7,132,819 issued on Nov. 7, 2006, entitled, "Floating Power Supply and Method of Using the Same," which is incorporated herein by reference in its entirety.

In an alternative embodiment the power line parameter sensor device 115 may include a different power system, such as a solar cell or battery, or kinetic energy converter (e.g., to convert vibrations to electrical energy), to provide power to the sensor device 115 circuits. As still another alternative, a power supply 221 may derive power from the power line 110 via inductance. Specifically, a transformer may be formed by a magnetically permeable core placed substantially around the entire circumference of power line 110 (perhaps with a gap) and a winding around the core. The power line 110, core, and winding form a transformer with the winding connected to the power supply 221. Current through the power line 110 induces a current in the winding, which supplies power to the sensor device 115 (for use by its transmitter and/or other components). Collectively, such power sources such as these (photonic, solar, battery, kinetic (e.g., from vibrations), and inductive power systems), which derive power via a method that isolates the MV power line voltage from the LV power line and the power line communication device, shall be referred to herein as an isolated power source. Isolated power sources other than the examples described herein may be employed as well.

FIG. 4 shows an embodiment in which a wireless link 222 carries measurement data from the power line parameter sensor device 115 to the power line communication device 137. In such embodiment the interface 206 may include a wireless transceiver 224 (e.g., IEEE 802.11a,b,g, or n or Bluetooth®, ISM band transceiver) or wireless transmitter which communicates with a wireless transceiver 226 (or receiver) of the power line communication device 137. In some such embodiments the power line parameter sensor device 115 also may include a power supply 223 with an isolated power source such as a solar cell, battery, a photonic power source, or an MV inductive power source, to provide power to the sensor device 115 circuits. When multiple sensor devices 115 are connected to a power line communication device 137, the wireless methods may include means for coordinating the transmissions from individual sensor devices 115 so that they do not interfere with each other and so that the power line communication device 137 can determine the source of the data. For example, a transceiver may use the ISM bands (915 MHz) and use an "ID Code" embedded in the data to identify the sensor device 115. Alternately, the links may communicate via different frequency bands.

FIG. 5 shows another embodiment in which a wireless link 230 carries measurement data from a radio frequency identification (RFID) transponder 232 of a power line parameter sensor device 115 to the power line communication device 137. In various embodiments the sensor device transponder 232 may be passive (having no power source of its own) or active (having its own power source). For example, in one embodiment the interface includes a passive radio transponder 232. The power line communication device 137 also includes a transponder 234 which transmits a signal to the power line parameter sensor device 115. The strength of the transmitted signal may provide enough power to drive the power line parameter sensor device's transponder 232 and, if necessary, the device's 115 other components as well. The sensor device 115 powers up, gathers one or more samples of the power line current, voltage, and/or other data, and transmits the sampled data back to the power line communication device 137 via transponder 232. In another embodiment the sensor device includes an active radio transponder having its own power supply, which may have an isolated power source as described herein.

In various embodiments, data from the sensor devices 115 of the system or within a region or neighborhood covered by a sub-portion of the system may be sampled substantially simultaneously (e.g., all sensor devices 115 sample within a thirty second, sixty second, three minute, or five minute time period). Such samples may be gathered at a set scheduled time, at regular times, at regular intervals, or in response to a command received from a remote computer. Uses of the measured (and processed) power line parameter data are described below in more detail.

In the embodiments described herein and others, the invention may employ a communication method that reduces the power needed to communicate the measured data over the non-conductive communication link. Specifically, reducing the power needed to communicate the data allows the sensor device to communicate data when very little power is available (e.g., from the isolated power source). In one example embodiment, the sensor device 115 includes a timing circuit that periodically wakes up the sensing and memory circuits (e.g., analog to digital converter and memory) from a reduced power state (e.g., hibernation or standby state) to allow the measurement(s) to be taken (samples converted to digital data), processed, and stored in memory. In addition, after a predetermined number of measurements have been taken and the associated data stored, the communication circuitry of the interface 206 may be "woken up" to transmit the stored data to the power line communication device 137 via the non-conductive communication link (e.g., the fiber optic conductor, through the air via a wireless transmitter or transceiver, etc.).

In one example embodiment, the communication circuitry is configured to transmit a plurality of samples of the parameter data in a bursting transmission, which may comprise a relatively high transmission rate and relatively short transmission time. Specifically, over a given time period (e.g., a day) a plurality of bursts of the parameter data may be transmitted, with each burst transmitting data of a plurality of the stored samples. The bursting at high data rates may allow the transmitter of the interface 206 of the sensor device 206 to remain powered down (or in a low power use state) a high percentage of the time. The bursting transmission over a time period (e.g., an hour or day) may have an extremely low duty cycle such as less than 0.01 (1%), more preferably less than 0.001 (0.1%), even more preferably less than 0.0001 (0.01%), and still more preferably less than 0.00001 (0.001%).

Backhaul Device 138:

Communication nodes, such as access nodes, repeaters, and other backhaul nodes, may communicate to and from the IP network (which may include the Internet) via a backhaul node 132. In one example embodiment, a backhaul node 132 comprises a backhaul device 138. The backhaul device 138, for example, may transmit communications directly to an aggregation point 124, or to a distribution point 127 which in turn transmits the data to an aggregation point 124.

Figure 6:
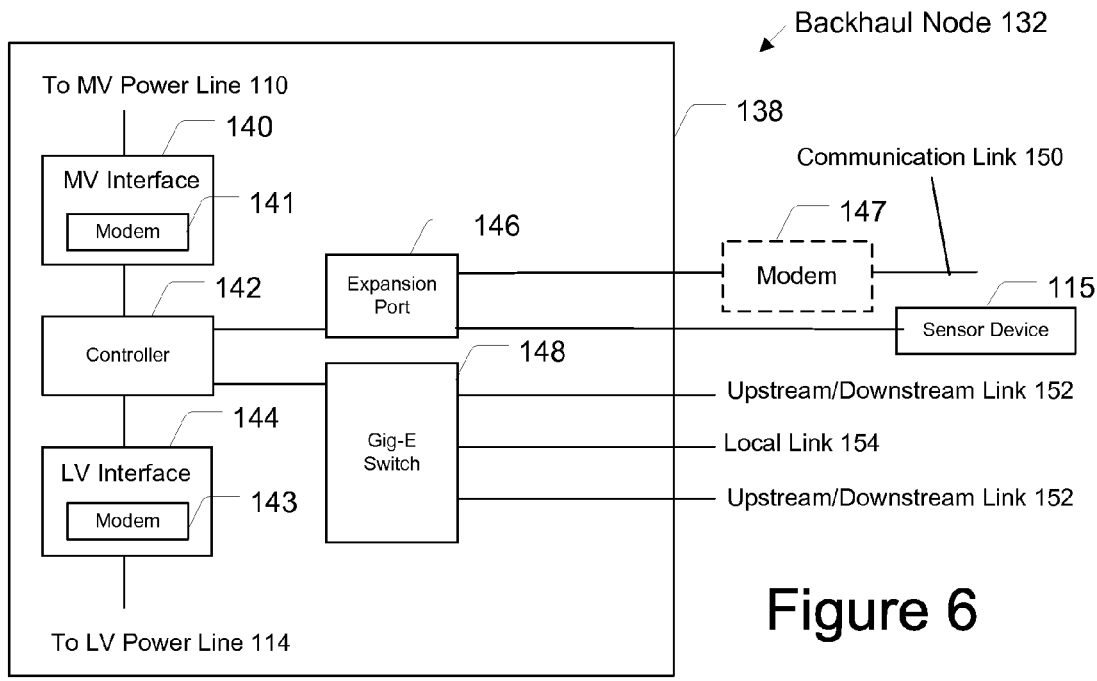
FIG. 6 is a block diagram of an example embodiment of a backhaul node.
Figure 7:
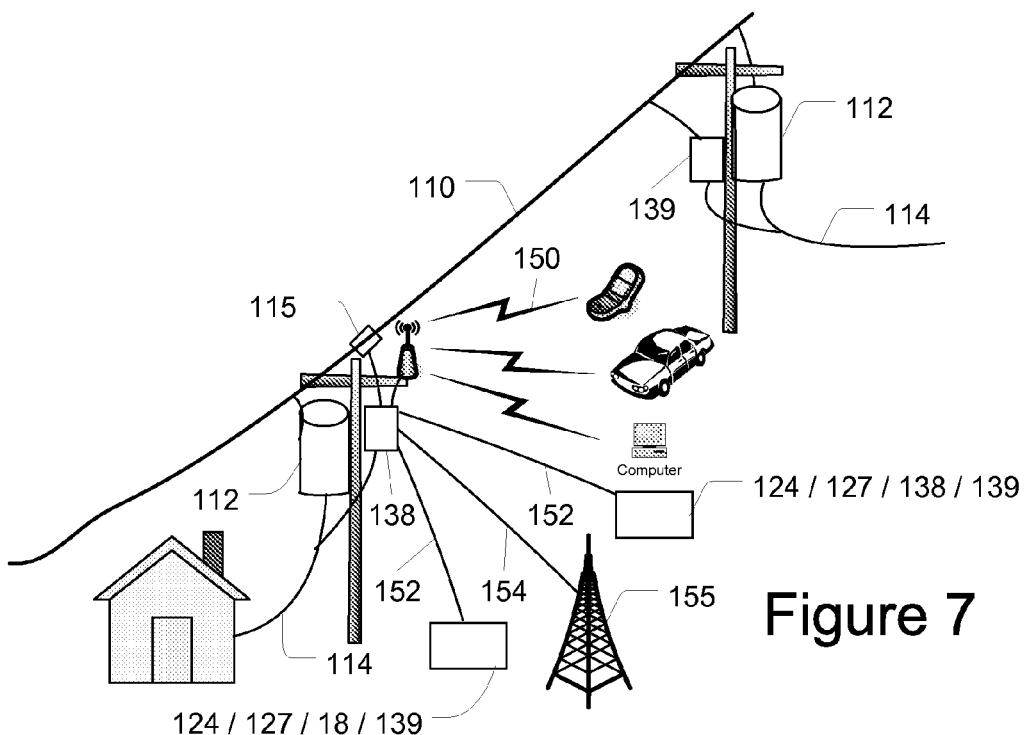
FIG. 7 illustrates an implementation of an example embodiment of a backhaul node.

FIGS. 6 and 7 show an example embodiment of a backhaul device 138 which may form all or part of a backhaul node 132. The backhaul device 138 may include a medium voltage power line interface (MV Interface) 140, a controller 142, an expansion port 146, and a gigabit Ethernet (gig-E) switch 148. In some embodiments the backhaul device 138 also may include a low voltage power line interface (LV interface) 144. The MV interface 140 is used to communicate over the MV power lines and may include an MV power line coupler coupled to an MV signal conditioner, which may be coupled to an MV modem 141. The MV power line coupler prevents the medium voltage power from passing from the MV power line 110 to the rest of the device's circuitry, while allowing the communications signal to pass between the backhaul device 138 and the MV power line 110. The MV signal conditioner may provide amplification, filtering, frequency translation, and transient voltage protection of data signals communicated over the MV power lines 110. Thus, the MV signal conditioner may be formed by a filter, amplifier, a mixer and local oscillator, and other circuits which provide transient voltage protection. The MV modem 141 may demodulate, decrypt, and decode data signals received from the MV signal conditioner and may encode, encrypt, and modulate data signals to be provided to the MV signal conditioner.

The backhaul device 138 also may include a low voltage power line interface (LV Interface) 144 for receiving and transmitting data over an LV power line 114. The LV interface 144 may include an LV power line coupler coupled to an LV signal conditioner, which may be coupled to an LV modem 143. In one embodiment the LV power line coupler may be an inductive coupler. In another embodiment the LV power line coupler may be a conductive coupler. The LV signal conditioner may provide amplification, filtering, frequency translation, and transient voltage protection of data signals communicated over the LV power lines 114. Data signals received by the LV signal conditioner may be provided to the LV modem 143. Thus, data signals from the LV modem 143 are transmitted over the LV power lines 110 through the signal conditioner and coupler. The LV signal conditioner may be formed by a filter, amplifier, a mixer and local oscillator, and other circuits which provide transient voltage protection. The LV modem 143 may demodulate, decrypt, and decode data signals received from the LV signal conditioner and may encode, encrypt, and modulate data signals to be provided to the LV signal conditioner.

The backhaul device 138 also may include an expansion port 146, which may be used to connect to a variety of devices. For example a wireless access point, which may include a wireless transceiver or modem 147, may be integral to or coupled to the backhaul device 138 via the expansion port 146. The wireless modem 147 may establish and maintain a communication link 150. In other embodiments a communication link is established and maintained over an alternative communications medium (e.g., fiber optic, cable, twisted pair) using an alternative transceiver device. In such other embodiments the expansion port 146 may provide an Ethernet connection allowing communications with various devices over optical fiber, coaxial cable or other wired medium. In such embodiment the modem 147 may be an Ethernet transceiver (fiber or copper) or other suitable modem may be employed (e.g., cable modem, DSL modem). In other embodiments, the expansion port may be coupled to a Wifi access point (IEEE 802.11 transceiver), WiMAX (IEEE 802.16), or mobile telephone cell site. The expansion port may be employed to establish a communication link 150 between the backhaul device 138 and devices at a residence, building, other structure, another fixed location, or between the backhaul device 138 and a mobile device.

Various sensor devices 115 also may be connected to the backhaul device 138 through the expansion port 146 or via other means (e.g., a dedicated sensor device interface not shown). Exemplary sensors that may form part of a power distribution parameter sensor device 115 and be coupled to the backhaul device 138 may include, a current sensor, voltage sensor, a level sensor (to determine pole tilt), a camera (e.g., for monitoring security, detecting motion, monitoring children's areas, monitoring a pet area), an audio input device (e.g., microphone for monitoring children, detecting noises), a vibration sensor, a motion sensor (e.g., an infrared motion sensor for security), a home security system, a smoke detector, a heat detector, a carbon monoxide detector, a natural gas detector, a thermometer, a barometer, a biohazard detector, a water or moisture sensor, a temperature sensor, and a light sensor. The expansion port may provide direct access to the core processor (which may form part of the controller 142) through a MII (Media Independent Interface), parallel, serial, or other connection. This direct processor interface may then be used to provide processing services and control to devices connected via the expansion port thereby allowing for a more less expensive device (e.g., sensor). The power parameter sensor device 115 may measure and/or detect one or more parameters, which, for example, may include power usage data, power line voltage data, power line current data, detection of a power outage, detection of water in a pad mount, detection of an open pad mount, detection of a street light failure, power delivered to a transformer data, power factor data (e.g., the phase angle between the voltage and current of a power line), power delivered to a downstream branch data, data of the harmonic components of a power signal, load transients data, and/or load distribution data. In addition, the backhaul device 138 may be connected to multiple sensor devices 115 so that parameters of multiple power lines may be measured such at a separate parameter sensor device 115 on each of three MV power line conductors 110 and a separate parameter sensor device on each of two energized LV power line conductors 114 and one on each neutral conductor. One skilled in the art will appreciate that other types of utility data also may be gathered. As will be evident to those skilled in the art, the expansion port may be coupled to an interface for communicating with the interface 206 of the sensor device 114 via a non-conductive communication link.

The backhaul device 138 also may include a gigabit Ethernet (Gig-E) switch 148. Gigabit Ethernet is a term describing various technologies for implementing Ethernet networking at a nominal speed of one gigabit per second, as defined by the IEEE 802.3z and 802.3ab standards. There are a number of different physical layer standards for implementing gigabit Ethernet using optical fiber, twisted pair cable, or balanced copper cable. In 2002, the IEEE ratified a 10 Gigabit Ethernet standard which provides data rates at 10 gigabits per second. The 10 gigabit Ethernet standard encompasses seven different media types for LAN, MAN and WAN. Accordingly the gig-E switch may be rated at 1 gigabit per second (or greater as for a 10 gigabit Ethernet switch).

The switch 148 may be included in the same housing or co-located with the other components of the node (e.g., mounted at or near the same utility pole or transformer). The gig-E switch 148 maintains a table of which communication devices are connected to which switch 148 port (e.g., based on MAC address). When a communication device transmits a data packet, the switch receiving the packet determines the data packet's destination address and forwards the packet towards the destination device rather than to every device in a given network. This greatly increases the potential speed of the network because collisions are substantially reduced or eliminated, and multiple communications may occur simultaneously.

The gig-E switch 148 may include an upstream port for maintaining a communication link 152 with an upstream device (e.g., a backhaul node 132, an aggregation point 124, a distribution point 127), a downstream port for maintaining a communication link 152 with a downstream device (e.g., another backhaul node 132; an access node 134), and a local port for maintaining a communication link 154 to a Gig-E compatible device such as a mobile telephone cell cite 155 (i.e., base station), a wireless device (e.g., WiMAX (IEEE 802.16) transceiver), an access node 134, another backhaul node 132, or another device. In some embodiments the gig-E switch 148 may include additional ports.

In one embodiment, the local link 154 may be connected to mobile telephone cell site configured to provide mobile telephone communications (digital or analog) and use the signal set and frequency bands suitable to communicate with mobile phones, PDAs, and other devices configured to communicate over a mobile telephone network. Mobile telephone cell sites, networks and mobile telephone communications of such mobile telephone cell sites, as used herein, are meant to include analog and digital cellular telephone cell sites, networks and communications, respectively, including, but not limited to AMPS, 1G, 2G, 3G, GSM (Global System for Mobile communications), PCS (Personal Communication Services) (sometimes referred to as digital cellular networks), 1× Evolution-Data Optimized (EVDO), and other cellular telephone cell sites and networks. One or more of these networks and cell sites may use various access technologies such as frequency division multiple access (FDMA), time division multiple access (TDMA), or code division multiple access (CDMA) (e.g., some of which may be used by 2G devices) and others may use CDMA2000 (based on 2G Code Division Multiple Access), WCDMA (UMTS)—Wideband Code Division Multiple Access, or TD-SCDMA (e.g., some of which may be used by 3G devices).

The gig-E switch 148 adds significant versatility to the backhaul device 138. For example, several backhaul devices may be coupled in a daisy chain topology (see FIG. 10), rather than by running a different fiber optic conductor to each backhaul node 134. Additionally, the local gig-E port allows a communication link 154 for connecting to high bandwidth devices (e.g., WiMAX (IEEE 802.16) or other wireless devices). The local gig-E port may maintain an Ethernet connection for communicating with various devices over optical fiber, coaxial cable or other wired medium. Exemplary devices may include user devices 130, a mobile telephone cell cite 155, and sensor devices (as described above with regard to the expansion port 146.

Communications may be input to the gig-E switch 148 from the MV interface 140, LV interface 144 or expansion port 146 through the controller 142. Communications also may be input from each of the upstream port, local port and downstream port. The gig-E switch 148 may be configured (by the controller 142 dynamically) to direct the input data from a given input port through the switch 148 to the upstream port, local port, or downstream port. An advantage of the gig-E switch 148 is that communications received at the upstream port or downstream port need not be provided (if so desired) to the controller 142. Specifically, communications received at the upstream port or downstream port may not be buffered or otherwise stored in the controller memory or processed by the controller. (Note, however, that communications received at the local port may be directed to the controller 142 for processing or for output over the MV interface 140, LV interface 144 or expansion port 146). The controller 142 controls the gig-E switch 148, allowing the switch 148 to pass data upstream and downstream (e.g. according to parameters (e.g., prioritization, rate limiting, etc.) provided by the controller). In particular, data may pass directly from the upstream port to the downstream port without the controller 142 receiving the data. Likewise, data may pass directly from the downstream port to the upstream port without the controller 142 receiving the data. Also, data may pass directly from the upstream port to the local port in a similar manner; or from the downstream port to the local port; or from the local port to the upstream port or downstream port. Moving such data through the controller 142 would significantly slow communications or require an ultra fast processor in the controller 142. Data from the controller 142 (originating from the controller 142 or received via the MV interface 140, the LV interface 144, or expansion port 146) may be supplied to the Gig-E switch 148 for communication upstream (or downstream) via the upstream port (or downstream port) according to the address of the data packet. Thus, data from the controller 142 may be multiplexed in (and routed/switched) along with other data communicated by the switch 148. As used herein, to route and routing is meant to include the functions performed by of any a router, switch, and bridge.

The backhaul device 138 also may include a controller 142 which controls the operation of the device 138 by executing program codes stored in memory. In addition, the program code may be executable to process the measured parameter data to, for example, convert the measured data to current, voltage, or power factor data. The backhaul 138 may also include a router, which routes data along an appropriate path. In this example embodiment, the controller 142 includes program code for performing routing (hereinafter to include switching and/or bridging). Thus, the controller 142 may maintain a table of which communication devices are connected to port in memory. The controller 142, of this embodiment, matches data packets with specific messages (e.g., control messages) and destinations, performs traffic control functions, performs usage tracking functions, authorizing functions, throughput control functions and similar related services. Communications entering the backhaul device 138 from the MV power lines 110 at the MV interface 140 are received, and then may be routed to the LV interface 144, expansion port 146 or gig-E switch 148. Communications entering the backhaul device 138 from the LV power lines 114 at the LV interface 144 are received, and may then be routed to the MV interface 140, the expansion port 146, or the gig-E switch 148. Communications entering the backhaul device 138 from the expansion port 146 are received, and may then be routed to the MV interface 140, the LV interface 144, or the gig-E switch 148. Accordingly, the controller 142 may receive data from the MV interface 140, LV interface 144 or the expansion port 146, and may route the received data to the MV interface 140, LV interface 144, the expansion port 146, or gig-E switch 148. In this example embodiment, user data may be routed based on the destination address of the packet (e.g., the IP destination address). Not all data packets, of course, are routed. Some packets received may not have a destination address for which the particular backhaul device 138 routes data packets. Additionally, some data packets may be addressed to the backhaul device 138. In such case the backhaul device may process the data as a control message.

Figure 8:
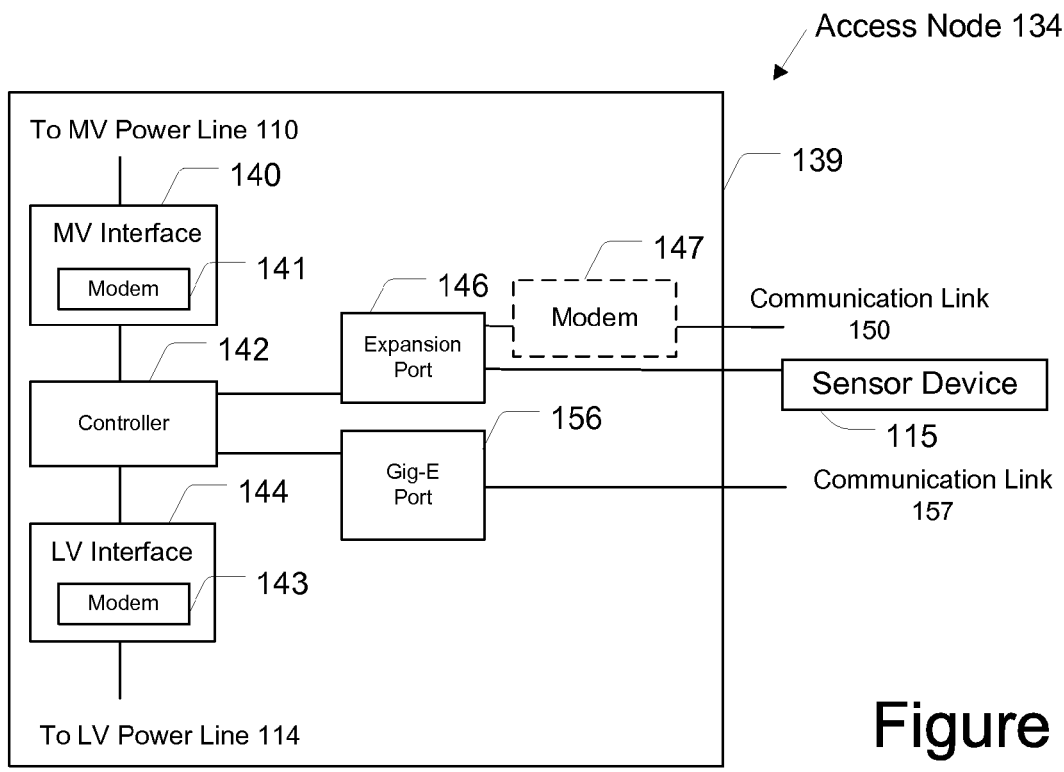
FIG. 8 is a block diagram of an example embodiment of an access node.
Figure 9:
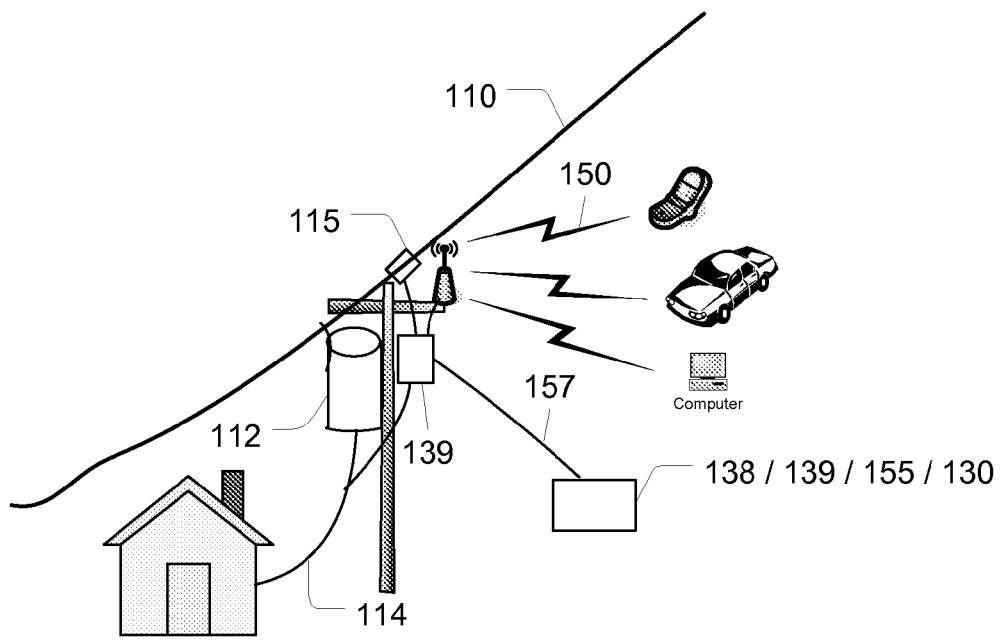
FIG. 9 illustrates an implementation of an example embodiment of an access node.

Access Device 139:

The backhaul nodes 132 may communicate with remote user devices via one or more access nodes 134, which may include an access device 139. FIGS. 8-9 show an example embodiment of such an access device 139 for providing communication services to mobile devices and to user devices at a residence, building, and other locations. Although FIG. 9 shows the access node 134 coupled to an overhead power line, in other embodiments an access node 134 (and its associated sensor devices 115) may be coupled to an underground power line.

In one example embodiment, access nodes 134 provide communication services for user devices 130 such as security management; IP network protocol (IP) packet routing; data filtering; access control; service level monitoring; service level management; signal processing; and modulation/demodulation of signals transmitted over the communication medium.

The access device 139 of this example node 134 may include a bypass device that moves data between an MV power line 110 and an LV power line 114. The access device 139 may include a medium voltage power line interface (MV Interface) 140 having a MV modem 141, a controller 142, a low voltage power line interface (LV interface) 144 having a LV modem 143, and an expansion port 146, which may have the functionality, functional components (and for connecting to devices, such as power line parameter sensor device 115) as previously described above with regard of the backhaul device 138. The access device 139 also may include a gigabit Ethernet (gig-E) port 156. The gig-E port 156 maintains a connection using a gigabit Ethernet protocol as described above for the gig-E switch 146 of FIG. 6. The power parameter sensor device 115 may be connected to the access device 139 to measure and/or detect one or more parameters of the MV power or the LV power line, which, for example, may include power usage data, power line voltage data, power line current data, detection of a power outage, detection of water in a pad mount, detection of an open pad mount, detection of a street light failure, power delivered to a transformer data, power factor data (e.g., the phase angle between the voltage and current of a power line), power delivered to a downstream branch data, data of the harmonic components of a power signal, load transients data, and/or load distribution data. In addition, the access device 134 may include multiple sensor devices 115 so that parameters of multiple power lines may be measured such as a separate parameter sensor device 115 on each of three MV power line conductors and a separate parameter sensor device 115 on each of two energized LV power line conductors and one on each neutral conductor. One skilled in the art will appreciate that other types of utility data also may be gathered. The sensor devices 115 described herein may be co-located with the power line communication device with which the sensor device 115 communicates or may be displaced from such device (e.g., at the next utility pole or transformer).

The Gig-E port 156 may maintain an Ethernet connection for communicating with various devices over optical fiber, coaxial cable or other wired medium. For example, a communication link 157 may be maintained between the access device 139 and another device through the gig-E port 156. For example, the gig-E port 156 may provide a connection to user devices 130, sensor devices (as described above with regard to the expansion port 146, such as to power line parameter sensor device 115), or a cell station 155.

Communications may be received at the access device 139 through the MV interface 140, LV interface 144, expansion port 146 or gig-E port 156. Communications may enter the access device 139 from the MV power lines 110 through the MV interface 140, and then may be routed to the LV interface 142, expansion port 146 or gig-E port 156. Communications may enter the access device 139 from the LV power lines 114 through the LV interface 144, and then may be routed to the MV interface 140, the expansion port 146, or the gig-E port 156. Communications may enter the access device 139 from the expansion port 146, and then may routed to the MV interface 140, the LV interface 144, or the gig-E port 156. Communications may enter the access device 139 via the gig-E port 156, and then may be routed to the MV interface 140, the LV interface 144, or the expansion port 146. The controller 142 controls communications through the access device 139. Accordingly, the access device 139 receives data from the MV interface 140, LV interface 144, the expansion port 146, or the gig-E port 156 and may route the data to the MV interface 140, LV interface 144, expansion port 146, or gig-E port 156 under the direction of the controller 142. In one example embodiment, the access node 134 may be coupled to a backhaul node 132 via a wired medium coupled to Gig-E port 156 while in another embodiment, the access node is coupled to the backhaul node 132 via an MV power line (via MV interface 140). In yet another embodiment, the access node 134 may be coupled to a backhaul node 132 via a wireless link (via expansion port 146 or Gig-E port 156). In addition, the controller may include program code that is executable to control the operation of the device 139 and to process the measured parameter data to, for example, convert the measured data to current, voltage, or power factor data.

Other Devices:

Another communication device is a repeater (e.g., indoor, outdoor, low voltage (LVR) and/or medium voltage) which may form part of a repeater node 135 (see FIG. 1). A repeater serves to extend the communication range of other communication elements (e.g., access devices, backhaul devices, and other nodes). The repeater may be coupled to power lines (e.g., MV power line; LV power line) and other communication media (e.g., fiber optical cable, coaxial cable, T-1 line or wireless medium). Note that in some embodiments, a repeater node 135 may also include a device for providing communications to a user device 130 (and thus also serve as an access node 134).

In various embodiments a user device 130 is coupled to an access node 134 using a modem. For a power line medium, a power line modem 136 is used. For a wireless medium, a wireless modem is used. For a coaxial cable, a cable modem is may be used. For a twisted pair, a DSL modem may be used. The specific type of modem depends on the type of medium linking the access node 134 and user device 130.

In addition, the PLCS may include intelligent power meters, which, in addition to measuring power usage, may include a parameter sensor device 115 and also have communication capabilities (a controller coupled to a modem coupled to the LV power line) for communicating the measured parameter data to the access node 134. Detailed descriptions of some examples of such power meter modules are provided in U.S. patent application Ser. No. 11/341,646, filed on Jan. 30, 2006 entitled, "Power Line Communications Module and Method," which is hereby incorporated herein by reference in it entirety.

A power line modem 136 couples a communication onto or off of an LV power line 114. A power line modem 136 is coupled on one side to the LV power line. On the other side, the power line modem 136 includes a connector to connect to a wired or wireless medium leading to the user device 130. One protocol for communicating with access nodes 132 over an LV power line is the HomePlug 1.0 standard of the HomePlug® Alliance for routing communications over low voltage power lines. In this manner, a customer can connect a variety of user devices 130 to the communication network 104.

The parameter sensor devices 115 and applications for using the related data also be incorporated in power line communication systems that communicate over underground power lines. Detailed descriptions of the components, features, and power line communication devices of some example underground PLCS are provided in U.S. patent application Ser. No. 11/399,529 filed on Apr. 7, 2006 entitled, "Power Line Communications Device and Method," which is hereby incorporated herein by reference in its entirety. The parameter sensor devices 115 described herein (or portions thereof) may be formed in or integrated with couplers for coupling communication signals to and from the power lines. For example, the Rogowski coils described above may be attached to the transformer side of the coupler (or integrated into the coupler) that couples to the underground (or overhead) MV power lines to allow installation of the coupler to also accomplish installation of the sensor device 115.

Network Communication Protocols:

Communication among nodes 128 may occur using a variety of protocols and media. In one example, the nodes 128 may use time division multiplexing and implement one or more layers of the 7 layer open systems interconnection (OSI) model. For example, at the layer 3 'network' level, the devices and software may implement switching and routing technologies, and create logical paths, known as virtual circuits, for transmitting data from node to node. Similarly, error handling, congestion control and packet sequencing can be performed at Layer 3. In one example embodiment, Layer 2 'data link' activities include encoding and decoding data packets and handling errors of the 'physical' layer 1, along with flow control and frame synchronization. The configuration of the various communication nodes may vary. For example, the nodes coupled to power lines may include a modem that is substantially compatible with the HomePlug 1.0 or A/V standard. In various embodiments, the communications among nodes may be time division multiple access or frequency division multiple access.

Software:

The communication network 104 may be monitored and controlled via a power line server that may be remote from the structure and physical location of the network elements. The controller of the nodes 128 describe herein may include executable program code for controlling the operation of the nodes and responding to commands. The PLS may transmit any number of commands to a backhaul nodes 132 and access nodes 134 to manage the system. As will be evident to those skilled in the art, most of these commands are equally applicable for backhaul nodes 132 and access nodes 134. For ease of discussion, the description of the commands will be in the context of a node 128 (meant to include both). These commands may include altering configuration information, synchronizing the time of the node 128 with that of the PLS, controlling measurement intervals (e.g., voltage measurements), requesting measurement or data statistics, requesting the status of user device activations, rate shaping, and requesting reset or other system-level commands. Any or all of these commands may require a unique response from the node 128, which may be transmitted by the node 128 and received and stored by the PLS. The PLS may include software to transmit a command to any or all of the nodes (134 and 132) to schedule a voltage and/or current measurement at any particular time so that all of the network elements of the PLCS take the measurement(s) at the same time.

Alerts

In addition to commands and responses, the node 128 has the ability to send Alerts and Alarms to the PLS. Alerts typically are either warnings or informational messages transmitted to the PLS in light of events detected or measured by the node 128. Alarms typically are error conditions detected.

One example of an Alarm is an Out-of-Limit Alarm that indicates that an out-of-limit condition has been detected at the node 128, which may indicate a power outage on the LV power line, an MV or LV voltage too high, an MV or LV voltage too low, a temperature measurement inside the node 128 is too high, and/or other out-of-limit conditions. Information of the Out-of-Limit condition, such as the type of condition (e.g., a LV voltage measurement, a node 128 temperature), the Out-of-Limit threshold exceeded, the time of detection, the amount (e.g., over, under, etc.) the out of limit threshold has been exceeded, is stored in the memory of the node 128 and transmitted with the alert or transmitted in response to a request from the PLS. In some embodiments, an alert may be transmitted that a transformer is operating below a predetermined efficiency.

Software Upgrade Handler

The Software Upgrade Handler software may be started by the node 128 Command Processing software in response to a PLS command. Information needed to download the upgrade file, including for example the remote file name and PLS IP address, may be included in the parameters passed to the Software Command Handler within the PLS command.

Upon startup, the Software Command Handler task may open a file transfer program such as Trivial File Transfer Protocol (TFTP) to provide a connection to the PLS and request the file. The requested file may then be downloaded to the node 128. For example, the PLS may transmit the upgrade through the Internet to the node 128 (and perhaps through the backhaul node, and over the MV power line) where the upgrade may be stored in a local RAM buffer and validated (e.g., error checked) while the node 128 continues to operate (i.e., continues to communicate packets). Finally, the task copies the downloaded software into a backup boot page in non-volatile memory, and transmits an Alert indicating successful installation to the PLS. The node 128 then makes the downloaded software the primary boot page and reboots. When the device restarts the downloaded software will be copied to RAM and executed. The device will then notify the PLS that it has rebooted via an alert indicating such. In addition, and through substantially the same procedure, new software code may be received by the controller for storage in (e.g., to replace existing code) and execution at the media access control (MAC) layer of the LV modem and/or the MV modem of the access device or the backhaul device.

ADC Scheduler

Any of the nodes described herein may include an analog to digital converter (ADC) for measuring the voltage, current, and/or other parameters of any power line 110, 114. The ADC may be located within the power line parameter sensor device 115 or within the power line communication device 138, 139, 135. The ADC Scheduler software, in conjunction with the real-time operating system, creates ADC scheduler tasks to perform ADC sampling according to configurable periods for each sample type. Each sample type corresponds with an ADC channel. The ADC Scheduler software creates a scheduling table in memory with entries for each sampling channel according to default configurations or commands received from the PLS. The table contains timer intervals for the next sample for each ADC channel, which are monitored by the ADC scheduler.

ADC Measurement Software

The ADC Measurement Software, in conjunction with the real-time operating system, creates ADC measurement tasks that are responsible for monitoring and measuring data accessible through the ADC 330 such as the power distribution parameter sensor devices 115 (including the current sensor devices 115 and voltage sensor devices) described herein. Each separate measurable parameter may have an ADC measurement task. Each ADC measurement task may have configurable rates for processing, recording, and reporting for example.

An ADC measurement task may wait on a timer (set by the ADC scheduler). When the timer expires the task may retrieve all new ADC samples for that measurement type from the sample buffer, which may be one or more samples. The raw samples are converted into a measurement value. The measurement is given the timestamp of the last ADC sample used to make the measurement. The measurement may require further processing. If the measurement (or processed measurement) exceeds limit values, an alert condition may be generated. Out of limit Alerts may be transmitted to the PLS and repeated at the report rate until the measurement is back within limits. An out of limit recovery Alert may be generated (and transmitted to the PLS) when the out of limit condition is cleared (i.e., the measured value falls back within limit conditions).

The measurements performed by the ADC, each of which has a corresponding ADC measurement task, may include node 128 inside temperature, LV power line voltage, LV power line current, MV power line voltage, and/or MV power line current for example. MV and LV power line measurements may be accomplished via the power line parameter sensor devices 115.

As discussed, the nodes may include value limits for most of these measurements stored in memory with which the measured value may be compared. If a measurement is below a lower limit, or above an upper limit (or otherwise out of an acceptable range), the node 128 may transmit an Out-of-Limit Alert. Such alert may be received and stored by the PLS. In some instances, one or more measured values are processed to convert the measured value(s) to a standard or more conventional data value.

The LV power line voltage measurement may be used to provide various information. For example, the measurement may be used to determine a power outage (and subsequently a restoration), or measure the power used by a consumer (when current data is also available) or by all of the consumers connected to that distribution transformer. In addition, it may be used to determine the power quality of the LV power line by measuring and processing the measured values over time to provide frequency, harmonic content, and other power line quality characteristics.

Figure 10:
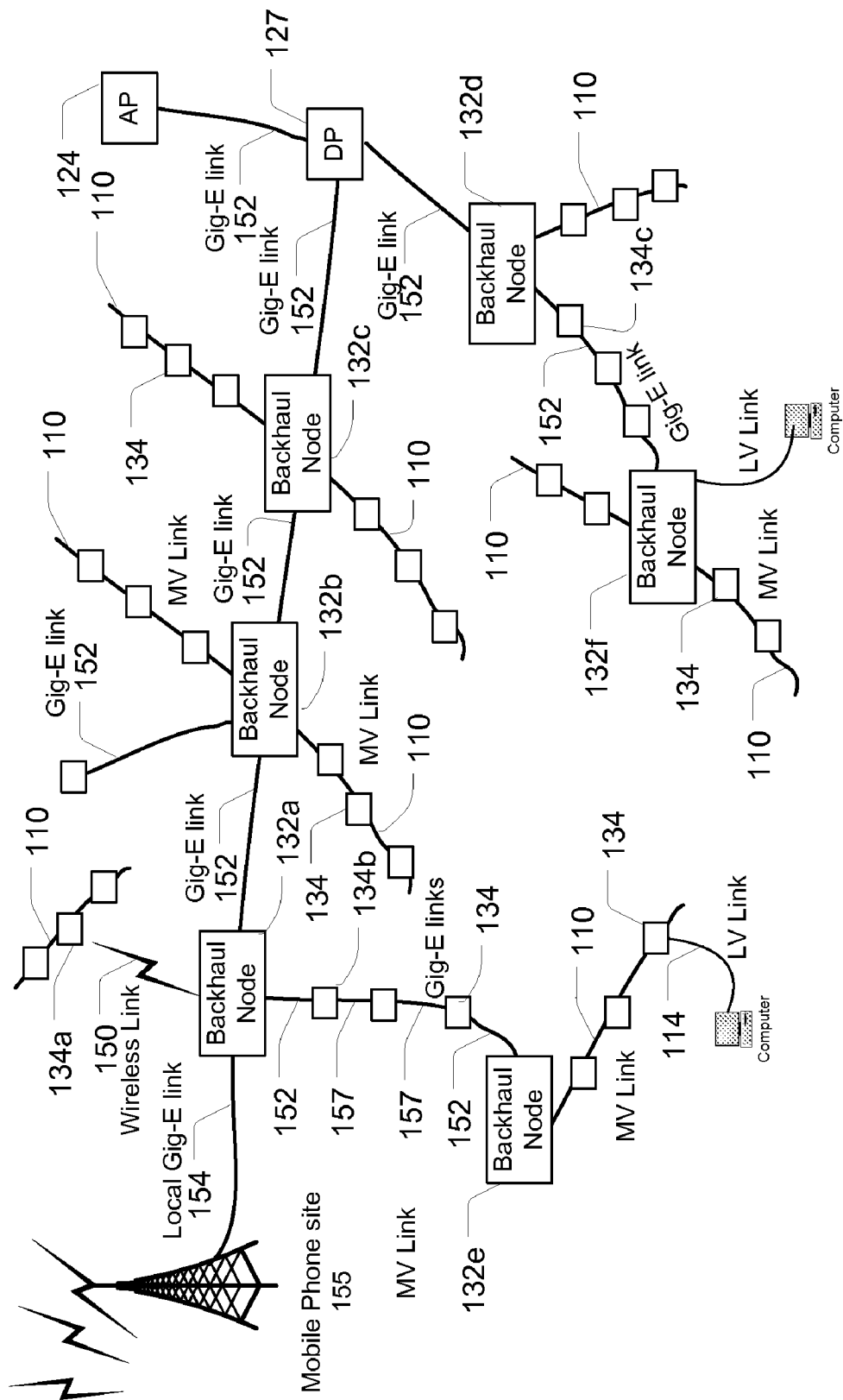
FIG. 10 is a partial network diagram showing an example topology of a power line communication and power distribution parameter system according to an example embodiment of the present invention.

Network Topology:

FIG. 10 shows an example embodiment of a network topology which illustrates many of the communication features of the backhaul node 132 and access node 134. For example, several backhaul nodes 132a-c may be coupled together in a daisy chain configuration by fiber optic communication links 152. Such links 152 may be formed by the upstream and downstream ports of the gig-E switch 148 of the respective backhaul nodes 132. The gig-E switch 148 also may be implemented to connect a backhaul node 132c to a distribution point 127. Accordingly, the gig-E switch 148 may form part of a communication link along a path for communicating with the internet 126. Further, a local port of a gig-E switch 148 may be implemented to couple a backhaul node 132a to a mobile phone site 155 via link 154. The backhaul nodes 132a-d also may be coupled to MV power lines 110 to maintain MV links for communication with multiple access nodes 134 (shown as small rectangles). The backhaul node 132a may also be coupled to an access node 134a (which may repeat data for other access nodes 134) over a wireless communication link 150, for example, through the expansion port 146. The backhaul node 132a is further illustrated to couple to a chain of access devices 134 and a backhaul node 132e. The link from the backhaul node 132a to the access node 134b may be formed by coupling a downstream port of the gig-e switch 148 of backhaul node 132a to the gig-E port 156 of the access node 134b. A similar link is shown between the backhaul node 132d and the access node 134c. Still another communication link is shown over an LV power line 114 to couple an access node 134d to a computer and to couple a backhaul node 132f to computer via a LV power line 114.

Determining Distribution Transformer Efficiency

According to one embodiment of the present invention, the efficiency of a given distribution transformer may be determined based upon the determined power input to the transformer and the determined power output from the transformer. Transformer efficiency may be computed as a ratio of the output power to the input power. For example, if the output power is 97 KW (kilowatts) and the input power is 100 KW, the efficiency is said to have 97 percent efficiency and the transformer has a three percent loss.

As will be evident to those skilled in the art, the distribution transformer may be part of an overhead power line power distribution network or an underground power line power distribution network. The distribution transformer may be for a single phase or a multiple phase power delivery network.

In one embodiment, the transformer's input current (from the MV power line) and output current (on the LV power line) may be measured by power distribution sensor devices 115, and the efficiency may be determined based upon the input current and output current measurements (along with estimated input and output voltages). In another embodiment, in addition to current, voltage may be measured on either or both of the input and output of the power lines, and the efficiency may be determined based upon the currents and voltages.

Figure 11A:
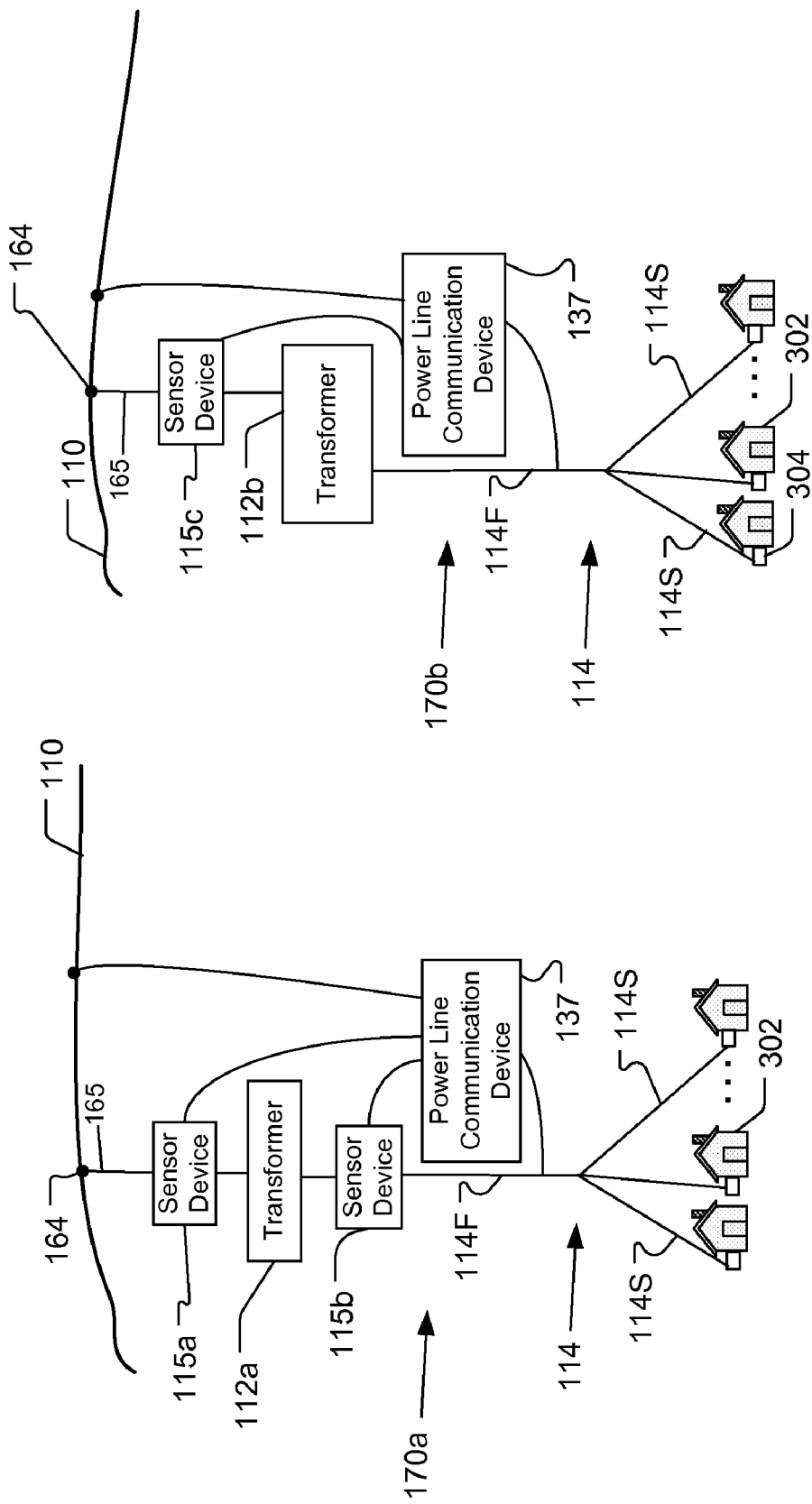
FIGS. 11a-c illustrate showing various example configurations for detecting power transformer overload according to example embodiments of the present invention.

FIG. 11a illustrates portions of a power line communication system for communicating over a power distribution system that includes MV power lines 110 and low voltage (LV) subnets 170a-b, which depict example configurations for practicing the present invention. Each LV subnet 170 may include a distribution transformer 112 and one or more LV power lines 114, and serve one or more homes, offices, building or other power customer premises 302. Power is supplied to each LV subnet 170 via the distribution transformer 112 that receives power from a MV power line 110. A distribution transformer 112, coupled to the MV power line 110, steps down the MV voltage to low voltage for distribution to the customer premises 302. A power line communication device 137 may be located in the vicinity of a distribution transformer 112 (e.g., mounted to the same or nearby utility pole or within the transformer enclosure) and manage power line communications for the devices connected to the transformer's associated LV subnet 170 (such as in-home user devices and/or utility meters). In various embodiments, a power distribution parameter sensor device 115 may be installed on each LV subnet 170 to measure one or more parameters (e.g., current, voltage, power factor, power) to determine the efficiency of the distribution transformer and other power line distribution parameters.

According to one configuration for practicing an embodiment of the present invention, LV subnet 170a may include sensor devices 115 installed in the vicinity of a distribution transformer 112a. Specifically, the a first set of one or more sensor devices 115a may be installed to measure one or more parameters on the upstream (MV) side of the transformer 112 and another second set of sensor devices 115b may be installed to measure one or more parameters on the downstream (LV) side of the transformer. Depending on the configuration, various parameters may be measured (one either or both sides of the transformer 112) to determine the efficiency of the transformer.

LV subnet 170a of FIG. 11a illustrates an example embodiment in which one sensor device 115a is installed on the tap conductor 165 that connects the distribution transformer 112a to the MV power line 110, which is used to measure parameters on the MV side of the transformer in order to determine the power input to the transformer 112. In this embodiment, sensor device 115a comprises a current sensor. In other embodiments, sensor device 115a may further included a voltage sensor.

The downstream sensor device 115b is installed on the LV feeder 114F of the LV power line 114 that supplies power to the LV power supply lines 114S, which extend to the customer premises 302. In this embodiment, sensor device 115b includes a current sensor and a voltage sensor to determine the output power of the distribution transformer. The voltage sensor, and in some instances the current sensor (or portions thereof) may be disposed inside the same housing as the PLCD 137 and is shown separate in the figures for ease of explanation. Sensor device 115b (as well as the other LV sensor devices described herein) may be configured to measure the current and voltage of one or multiple LV energized conductors. If the sensors of the sensor device 115b measure parameters on multiple energized conductors, the power data derived from the measurements of each conductor may be added (or otherwise combined) together to determine the total output power of the transformer 112. In another example, parameter sensor devices 115b may be installed on each LV power supply line 114S in the LV subnet 170a (to measure the current carried towards each customer premises 302) and the data from each may be added or otherwise combined together to determine the total output power of the distribution transformer. In yet another embodiment, the voltage and current of one energized conductor may be measured (and assumed to be the same in both energized conductors) and the total output power estimated to be twice the power as computed via the set of measurements. Measurements may be real-time and converted to root-mean-square (RMS) by the PLCD 137 or the sensor devices 115 themselves.

In this example embodiment, the input current is measured, and the output voltage and output current are measured, but the voltage at the input is not measured (but could be in alternate embodiments). By knowing the output voltage and the turns ratio of the transformer 112 (which may be stored in the memory of the PLCD 137), the input voltage to the transformer 112 may computed (Vin=Vout*Ts/Tp, where Tp=number of turns of primary winding and Ts=number of turns of secondary winding of the transformer). The efficiency of the transformer for transforming apparent power (sometimes also referred to as complex power) may then be determined by dividing the power output by the power input (e.g., by Pa=(Vout*Iout)/(Vin*Iin)).

In many instances, determining the efficiency of the transformer to transform (step down) apparent power may be sufficient. However, such measurements measure apparent power (Volt-Amps) that includes both a real and reactive power component. Because the utility only gets paid for the real power delivered, in some implementations it may be desirable to determine the transformer's efficiency for transforming (stepping down) the real power component of the power. The ratio between the real power and the reactive power is referred to as the power factor. A power factor of one (1) means that the current and voltage are in-phase and that the apparent power is entirely real power (i.e., there is no reactive power component). The real power may be determined by multiplying the apparent power by the power factor. Thus, the present invention may further factor in the power factor to determine the efficiency of the transformer 112 in stepping down real power.

In one embodiment, the power factor of the output power of the transformer 112 on the low voltage power line 114 may be measured (e.g., via a semiconductor device forming part of a sensor device 115) or computed from measured voltage and current data (e.g., determining the phase difference between the measured current and voltage). From the power factor, the real output power of the transformer 112 may then be computed by multiplying the power factor by the measured apparent power (Volt-Amps). The power factor of the input power (on the MV side) may be similarly measured or may be estimated based on measurements elsewhere (e.g., on the LV power lines, at the substation, at other transformers 112, or at other places on the MV power line). The power factor of the input power may alternately be estimated based on the determined power factor on the LV power line and the transformer's known affects on the power factor (e.g., known from its ratings data, field measurements, or lab measurements), which may be based on the particular size and/or model of the transformer 112. In other words, by knowing how the transformer 112 typically affects the power factor (e.g., a reduction by one percent), the power factor of the power into the transformer may be estimated (e.g., either an average or worst case) based on the power factor of the LV power output from the transformer. Using the power factor of the power input to the transformer, the real power input to the transformer may be computed (Power Factor input*Volt-Amps input) to thereby determine real power efficiency of the transformer (Efficiency=Power out/Power in).

As discussed, this example embodiment does not employ MV side voltage measurements. However, other embodiments may perform such voltage measurements via voltage sensor devices that are installed in the vicinity of the power distribution transformer 112a to measure the input voltage. Such voltage sensor may be located in the vicinity of (or integrated with) the current sensor of the sensor devices 115a. In other embodiments the voltage sensor device on the MV side of the distribution transformer 112a may be more remotely located. Voltage along the MV power line may be assumed to be generally the same across a given MV section or may be estimated at various transformers 112 based on measurements at a MV substation. Accordingly, a voltage sensor device may not be necessary in the vicinity of each distribution transformer 112.

According to another configuration for practicing the present invention illustrate in FIG. 11a, LV subnet 170b may include one or more power distribution parameter sensor devices 115c on the MV side of the distribution transformer 112b to determine the input current, and, depending on the embodiment, the input voltage to the transformer 112b. If the voltage on the MV is not measured, it may be estimated based on other MV voltage data or based on LV voltage measurements from a sensor device 115 on the LV power line 114 (not depicted in LV subnet 170b of FIG. 11) or determined via other processes described herein.

In this embodiment, LV subnet 170b need not include a power distribution parameter sensor device on the LV power lines 114 of the distribution transformer 112b to determine the output power (but may include the sensor devices, but not use them for purposes of determining transformer efficiency). The output power may be determined from the power usage data for each customer premises served by the distribution transformer 112b. In particular, each of the customer premises 302 may include an associated power utility meter 304 capable of communicating with the PLCD 137 (or PLS or other device). The power provided to each of the respective premises 302 by the distribution transformer 112b may be determined by the meters 304 and transmitted to the PLCD 137, which sums the data together to determine the total output power of the transformer 112 over a given time period. In particular, by obtaining power usage data from each of the meters 304 over a generally concurrent time period, (e.g., between a first time and a subsequent second time), the average power output from the transformer 112b may be derived for such time period. For example, the PLCD 137 may obtain power usage data from each power utility meter 304 every five minutes, fifteen minutes, or other time period although the specific time period may vary. In addition, the meters 304 may be configured to measure the instantaneous power being supplied to the customer premises 302—either periodically or in response to a command received via the PLCD 137 or other communication device. The line loss of the low voltage power line 114 may be estimated and added to the summed power data (from the meters) to estimate the output power of the transformer. Various embodiments of such a meter 304 for communicating power usage data are described in U.S. patent application Ser. No. 11/341,646, filed Jan. 30, 2006, entitled Power Line Communications Module and Method, which is hereby incorporated by reference in its entirety.

Figure 11B:
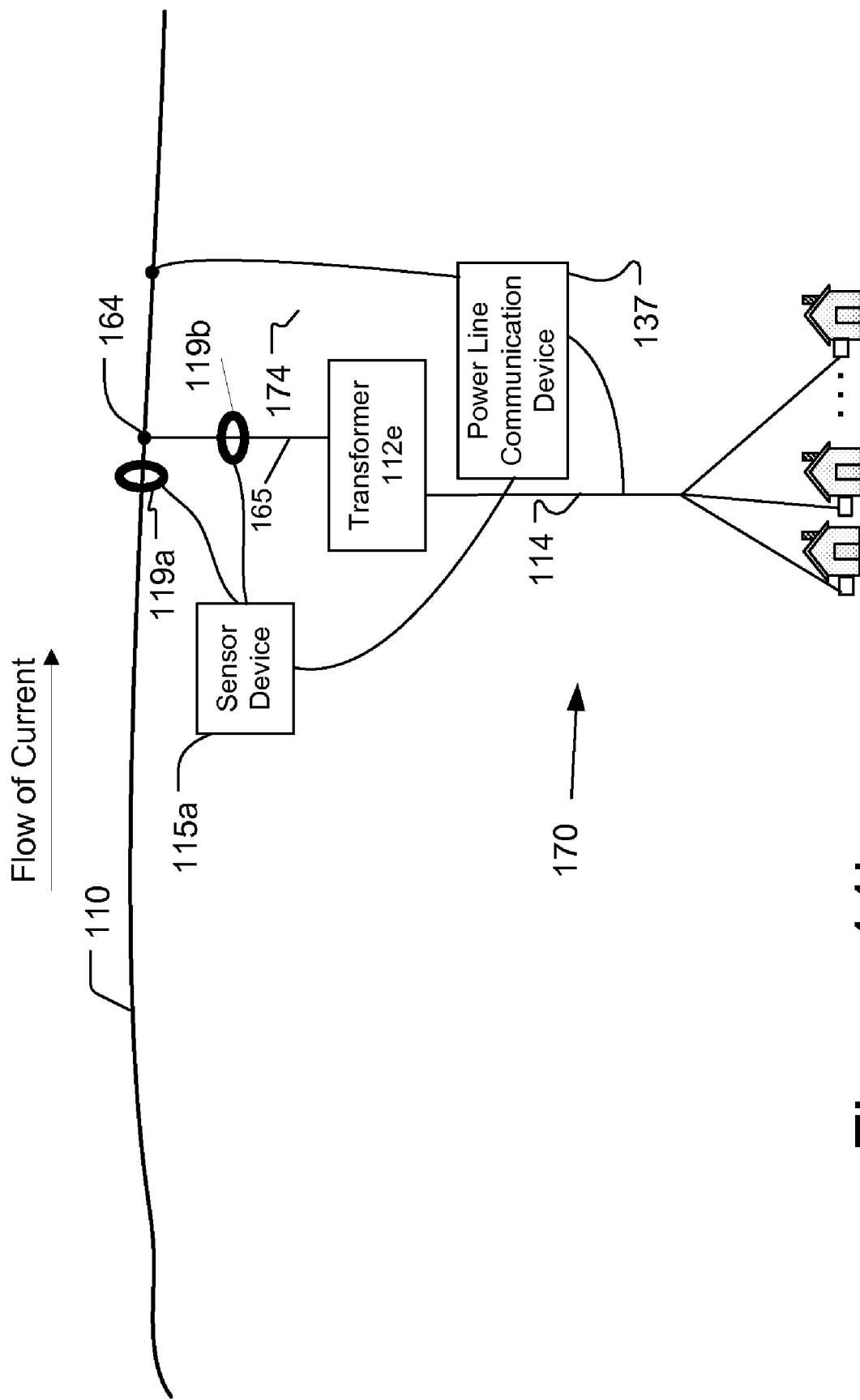

An alternate configuration of an LV subnet 170 is illustrated in FIG. 11b wherein current sensor 119b is installed on the tap conductor 165 (the conductor that connects the transformer to the MV power line 110) while the other current sensor 119a remains on the MV power line 110. Both sensors 119a and 119b may share common electronics disposed in the sensor device housing to process measurements, power the sensors 119 (if necessary), and communicate with PLCD. Using this configuration, the sensor device 115a can measure the current into the transformer 112 (via the sensor 119b coupled to the tap conductor 164) and also measure the current carried by the MV power line 110 directly before the tap connection 164. In yet another embodiment, sensor 119a may be installed after the tap connection 164 to measure the current after the tap while sensor 119b is installed on the tap conductor 165. As discussed elsewhere herein, data of the measured currents can be transmitted and/or used for various purposes such as, for example, to determine whether the MV power line 110 is approaching (or is over) maximum capacity (in addition to determining the power input to the distribution transformer).

Figure 11C:
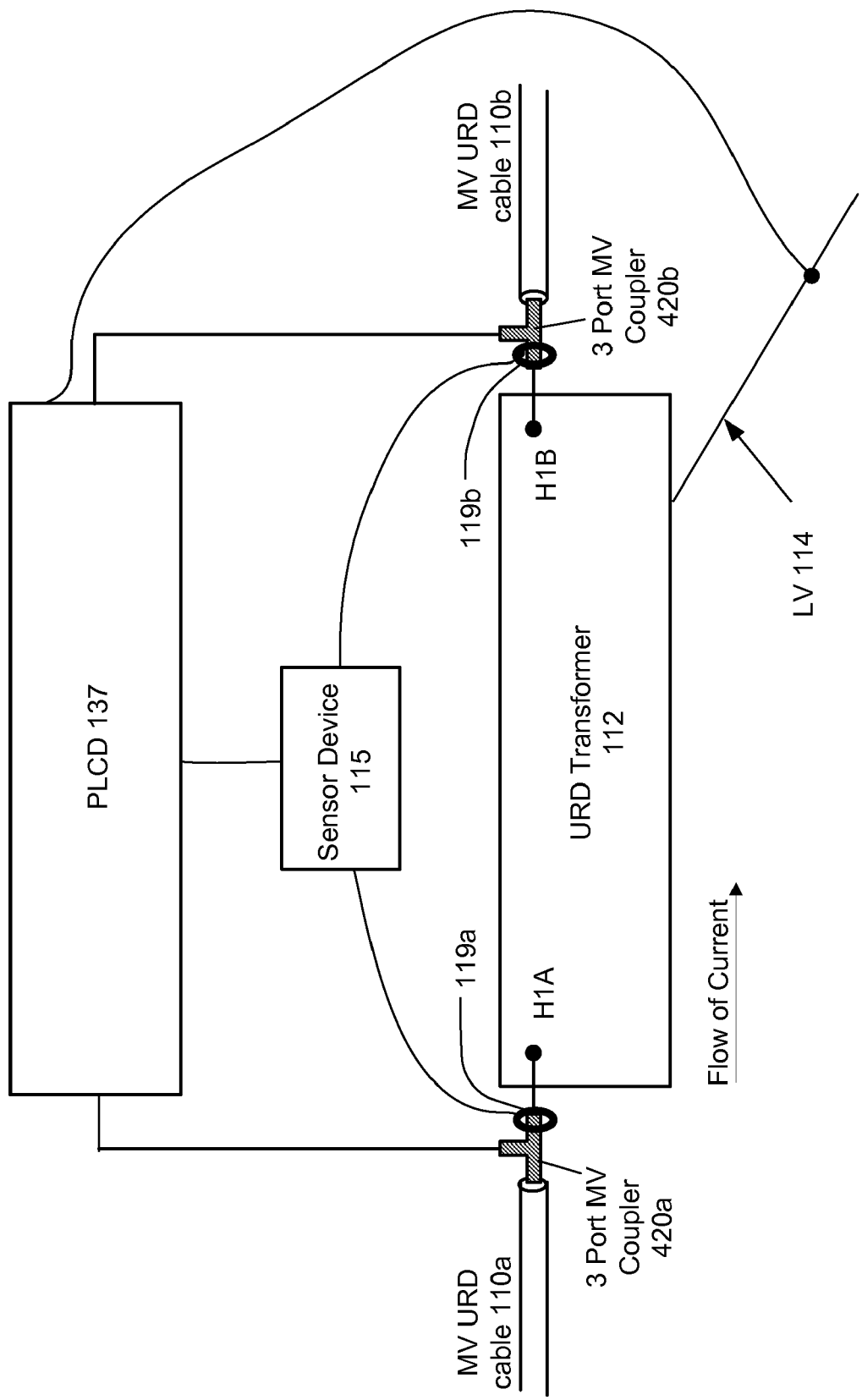

FIG. 11c illustrates another example configuration for use with underground residential distribution (URD) transformers. As illustrated, URD transformers 112 are configured differently from overhead transformers as there is no tap conductor connecting the MV power line 110 to the transformer 112. More specifically, the URD cable is connected to two terminals (H1A and H1B) of the transformer and the current flows "through" the transformer as shown. In this embodiment, the PLCD 137 is a three port device that is connected to the upstream MV power line segment 110a (which may be connected to an upstream transformer) via coupler 420a, the downstream MV power line segment 110b (which may be connected to a downstream transformer) via coupler 420b, and to the LV power line 114 for communication with devices in (and/or utility meters at) one or more customer premises. In this embodiment sensor 119a is coupled to upstream MV power line segment 110a and sensor 119b is coupled to the downstream MV power segment 110b. Similar to other configurations described herein, measuring the current before (sensor 119a) and after (sensor 119b) the transformer 112 allows one to determine the current provided to the transformer 112. Both sensors 119 are connected to the sensor device 115, which itself is connected to the PLCD 137. It is worth noting that URD power lines are insulated power lines and the sensors 119 (which may include, for example, a Rogowski coil or other sensor) may be disposed around (external to) the insulation of the power line at a location where the external neutral of the power line has been removed or pealed away. In this embodiment, the current sensors 119 may be integrated with or mounted beside (and be separate from) the couplers 420. While the sensors 119 are shown on the transformer side of the couplers 420, they could be mounted on the opposite side of the couplers 420 as well. While the sensor device 115 is shown separately from the PLCD, this configuration may be more suitable for combining the sensor device 115 and its circuitry with (e.g., in the same housing as) the PLCD circuitry. This is because there is no need to isolate the sensor device 115 from the PLCD, because the sensor device 115 is not exposed to MV voltages (because the MV URD cable is insulated).

For each of the embodiments illustrated in FIGS. 11a-c, and others, power line current, power line voltage, and/or power usage data may be sampled at regular times, periodically, aperiodically, at one or more scheduled times, or in response to specific commands or triggering events. LV subnet power distribution parameters may be measured independently of other LV subnet measurements and gathered at each PLCD 137, or be measured substantially at the same time concurrently. For example, utility meter data and/or sensor device data from a building, neighborhood, a city, a country, or other region may be measured at substantially the same time (e.g., within a five, ten, fifteen, thirty, or sixty minute time window). Alternately, utility meter data and/or sensor device data for the entire power line distribution system 104 (see FIG. 1) may be collected. Such samples and/or processing results may be stored in memory at each PLCD 137 for subsequent processing and/or transmission. For example, the PLCD may periodically process the sensor device data, or the accumulated power usage data, to determine whether an exception condition exists (e.g., transformer operating below a threshold efficiency). Alternatively or in addition, the obtained and/or processed data may be transmitted to a remote computer, such as the power line server 118 for further processing.

Various methods may be practiced to determine and report distribution transformer efficiency, and to respond to a sub-threshold efficiency condition. In some embodiments, a PLCD 137 may obtain utility meter data and/or sensor device data, and process the data to determine whether the distribution transformer 112 is operating below a threshold efficiency. The utility meter data, sensor device data and/or processing results may be communicated via a notification to the PLS 118 or other processing system, which provides further notice to the utility that includes information sufficient to identify the transformer (e.g., pole number) and its location. In other embodiments, the PLCD 137 (or other device) obtains the utility meter data and/or sensor device data, may perform some processing (e.g., convert the data to RMS values, time stamps the data, etc.), and transmits information (e.g., power input, power output, power factor, etc.) to the PLS 118 or other system, which processes the data to determine whether a sub-threshold efficiency condition exists. In still other embodiments, the PLCD 137 (or other device) merely gathers and transmits the utility meter data or sensor device data (e.g., data of the voltage, current, etc.) to the PLS 118 or other system, which processes the data to determine the input power, the output power (and in some instances the power factor(s) and/or voltages) to determine whether a sub-threshold efficiency condition exists. The received data may be stored and processed by the PLS or remote computer system to provide a notification (e.g., to the utility) of transformers operating below a threshold efficiency. In one embodiment, some or all of the data may be collected from the PLCD 137 via a roaming vehicle that includes a wireless transceiver (ZigBee wireless (IEEE 802.15)) and that poles the PLCDs 137 (and/or meters) for the desired data, which is later supplied to a remote computer.

Figure 12:
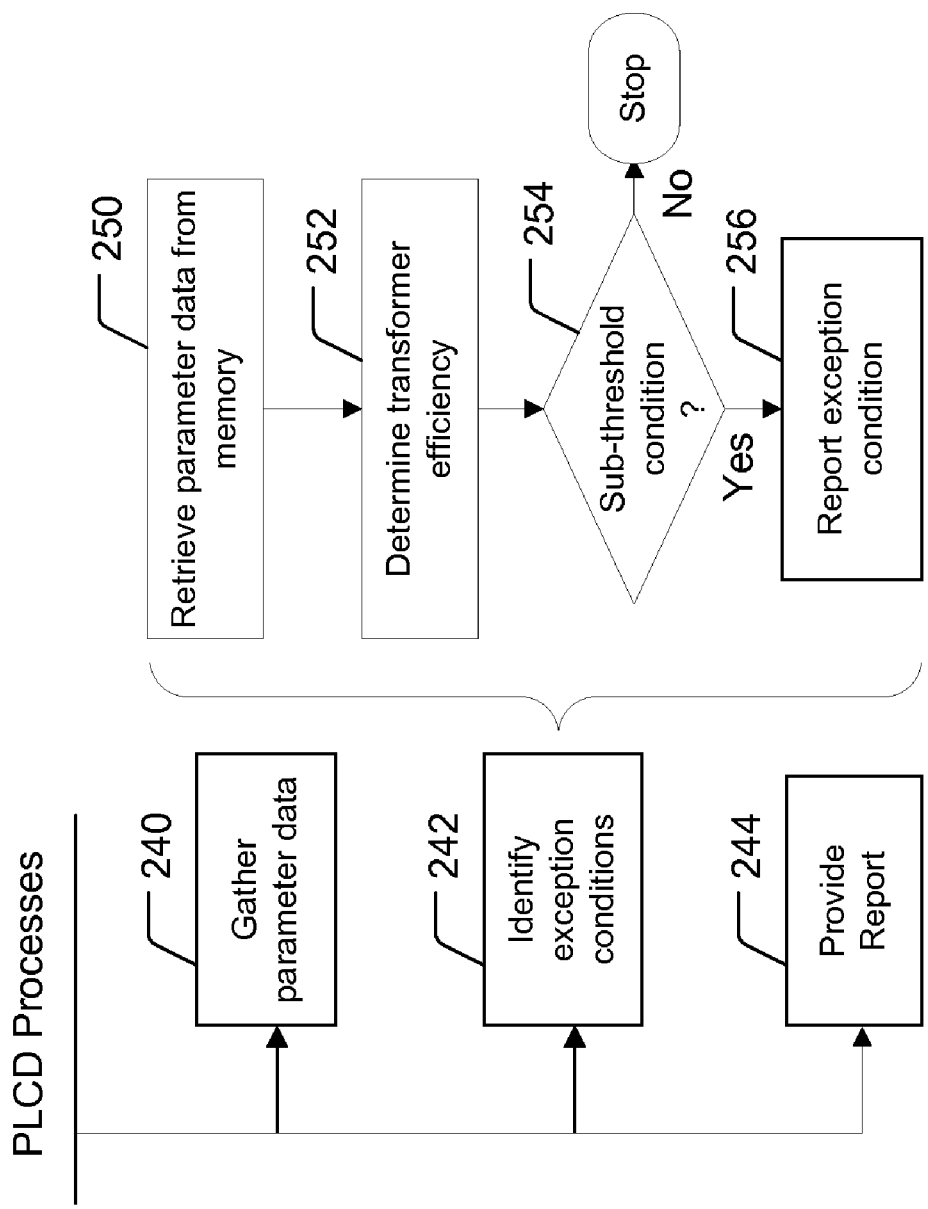
FIG. 12 is a flow chart of processes performed at a power line communication device for determining distribution transformer efficiency, according to a sample embodiment of the present invention.

FIG. 12 is a flow chart depicting a few of the processes performed by the PLCD 137, according to an example embodiment of the present invention. One process 240 includes the steps of gathering or receiving data such as from one or more parameter sensor devices 115 and/or power meters 304. Such data may be stored in memory at the PLCD. Another process 242 includes the steps for processing the sensor device data and/or power usage data. More particularly, for purposes of the present invention, the process 242 for identifying an exception condition comprises determining whether distribution transformer efficiency is below a predetermined threshold value and may include multiple processes itself. At step 250, for example, parameter data and/or power usage data may be retrieved from memory. At step 252 the efficiency of the distribution transformer 112 associated with the data may be determined. At step 254 the determined efficiency may be compared to a threshold efficiency value (which may have been stored in memory). If a sub-threshold condition is not present, then no further actions are taken in some embodiments (and in other embodiments a notification may be provided). If a sub-threshold condition is present, then at step 256 the exception may be logged (stored) and/or reported. For example, the exception may be logged, and subsequently transmitted to the PLS 118 by the reporting process 244

As discussed process 244 includes the step of providing a report (i.e., a notification) reporting data and/or processing results such as to the PLS 118 or other remote processing center. Such reporting may include routine scheduled reporting where the power usage, sensor device data, power factor, and/or processing results are uploaded. Such reporting also may be in response to specific commands. Such reporting may include the determined efficiency of the transformer and/or a notification that (or, alternately, whether or not) the transformer is operating below the threshold efficiency.

While the processes of FIG. 12 have described in the context of being performed by a PLCD 137, in some embodiments they be performed by the PLS 118 or another remote computing system. For example, if these processes are performed by the PLS 118, step 240 may include gathering the data from a plurality of PLCDs 137 and using the received data to identify transformers operating below a threshold efficiency at step 242, which may be different for each transformer model. The PLS 118 may then report the identity and/or location of all the transformers operating below a threshold value periodically (e.g., monthly, weekly, daily, yearly) at step 244 to another computer system (e.g., of the utility). Such reporting may include storing information in a database of the remote computer system, transmitting a notification, or transmitting a file (to the computer system or a person associated with the remote computer system) that provides the information.

Determining transformer efficiency for a given transformer, and determining whether the efficiency is below a predetermined threshold value may require storage of a threshold efficiency value stored in a memory (e.g., of a PLCD 137 or the PLS 118). The threshold value may vary according to the transformer, and be based on a transformer rating.

Different threshold values may be used for different load conditions, such as for peak load, off-peak (low) loads, at approximately median load, at approximately average load, and/or different times of the day, week, month, or year. Further, different responses may be performed for exceptions occurring under different conditions. For example, a transformer may perform satisfactorily under peak load conditions, but operate below a desired threshold for small loads (e.g., one customer premises) in which instance it may not be cost efficient to replace such a transformer. It may be cost efficient to replace a distribution transformer serving a large neighborhood with high demand when such transformer operates at, for example, 93% instead of 97%. However, it may not be cost efficient to replace another distribution transformer serving one residential customer premise having relatively small load operating at the same 93% efficiency.

According to alternative embodiments of the present invention, alternative methods may be implemented for identifying a distribution transformer that is operating inefficiently. In one embodiment, LV power line voltage near the output of the distribution transformer may be monitored over time. The monitored voltage may be processed to identify harmonic patterns in the transformer 112 output voltage. Harmonics adversely impact the transformer efficiency and could damage the windings. Very often the damage to the transformer windings may not be identified until a failure occurs. In particular, harmonic loads may increase winding eddy current losses in a distribution transformer. The increase in transformer eddy current loss due to harmonics may have a significant effect on the operating temperature of the transformer, and thus on the useful life and efficiency of the transformer. When harmonics are identified, and are ongoing or occur repeatedly, the transformer may need to be de-rated. Thus, presence of adverse harmonics may be an exception condition to be reported to the PLS 118. In such cases, a higher rated distribution transformer may be more suitable for the location.

According to another alternative method for identifying a distribution transformer that is operating inefficiently, the temperature of the transformer case may be monitored (via a contact sensor or infrared imaging sensor). When the temperature of the transformer case (as determined by a temperature sensor of a sensor device 115 attached to the transformer case) is too high relative to the ambient temperature and the LV power line current, too much energy may be being lost to heat. Correspondingly, this means that the transformer efficiency is reduced. In a specific embodiment, a temperature disparity (a disparity between the measured temperature and the expected temperature that is based on a calculation of the output power (or current) and the ambient temperature taken at night) of more than a few degrees may be treated as an exception condition to identify a distribution transformer having a sub-threshold efficiency.

The methods for determining distribution transformer efficiency provide many benefits and advantages to a power distribution network. Various stages of reporting may be implemented to alert operators of inefficient transformers. Utility technicians may better prioritize maintenance, replacement and installation of distribution transformers. Improved prioritizing of the replacement and installation of transformers may minimize transformer failures caused by poorly performing transformers, and extend the life of other installed transformers.

Other advantages also may be achieved. By gathering power distribution parameter data, such as power line current, power line voltage, power factor data, transformer efficiency and other parameter data, the overall efficiency of the power distribution system may be improved. Planning may be managed more efficiently to replace poorly performing or underperforming transformers. As a result, wasted power corresponding to transformer losses may be avoided. Build-out of further infrastructure may be deferred because demand may be met by the improved efficiency of the distribution network.

Similarly, while the described embodiments communicate data via a power line communication system, the sensor devices 115 may be combined with wireless communication devices (e.g., mobile telephone network transceivers, two way wireless pager system transceivers, WiFi transceivers, WiMAX transceivers, or other transceivers) to communicate via a wireless data network (e.g., to communicate data and/or to provide notifications of exception conditions such as inefficient transformers). In addition, the sensor devices 115 used for measuring the power described herein may take various forms and be comprised of any implementations of sensors and other software and circuitry suitable for the application and is not limited to the sensor devices described herein.

Various embodiments may make use of transformer ratings, turns ratio of the transformers, efficiency ratings, threshold efficiency, the anticipated effect of the transformer on the power factor, LV line loss data (or equations thereof), and other data—any and all of which may be stored in memory of the PLCD 137 and/or PLS 118 (or other computer system) as needed or desired. Such data may be updated at the PLCDs 137 by communications from the PLS 118 as needed or desired. In some embodiments, peak hour and off peak hour efficiency may be determined (peak and off peak time periods being determined based on LV current measurements or power usage data measurements). The threshold efficiency may be the same or different for the peak hour and off peak hour efficiencies. In addition, the threshold efficiency may vary based on the time of the year or ambient temperature (as measured by the PLCD 137 or determined by the PLS from other sources). Also, in many embodiments, it may be necessary to determine that the efficiency is below a threshold efficiency for a predetermined percentage of time (e.g., thirty percent of each day, week, or month) before a notice is provided. In such an embodiment, the start and stop times of below threshold efficiency operating times may be stored in memory to make the computation. Alternately, it may be necessary to determine that the reduced (below threshold) efficiency causes a predetermined power loss per time period (e.g., one KW per day, week, or month) before a notice is provided in which case the power consumed during the time periods of below threshold operation may need to be measured and stored in memory. Such determinations of losses per time period and/or percentage of time below threshold frequency may be performed by the PLCD 137, PLS or other remote computing system. Transformers that are determined to be operating below threshold efficiency (e.g., during peak time periods, off-peak time periods, or both) for a predetermined time or a predetermined percentage of the time, that are determined to be causing a power loss that is greater than a predetermined threshold, or that is otherwise inefficiency in accordance with design parameters, may be flagged for replacement, which may include storing information of the transformer's location (e.g., pole number) and transformer information (e.g., model, rating, type (URD or OH) etc.) in memory. When determining whether the transformer is to be replaced, the computing system may estimate the cost of a replacement transformer, transport, disposal, installation, etc. with the costs incurred due to power losses over the remaining life of the inefficient transformer.

While the above description provides a means for determining the efficiency of the transformers in a power distribution network, it may also be used to determine other efficiencies and parameters. For example, a MV power line will extend to (and provide power to) numerous (e.g., dozens of) distributions transformers. The present invention can be used to determine the power input to each of the transformers connected to the MV power line (by any of the methods described herein including but not limited to measuring the input current and estimating the input voltage). Each of the PLCDs 137 that determines the power input to one of the transformers may communicate the input power data (preferably time stamped) to the PLS 118 or another remote computer system for storage and processing, which processing may including summing the data of the power input to the transformers to determine the total power received by all the transformers. In addition, the power output at the substation (that supplies power to the MV power line) can be measured or may already be known to the utility via its sensor equipment. The input power to the MV power line may be compared to the power received by distribution transformers to determine the line loss of the MV power line. Similarly, the efficiency of the MV power line may be determined by dividing the power received by the power input. Similarly, the line losses of the LV power lines may be determined by comparing the power output at the transformer (measurements of the current and voltage by the PLCD 137 on the LV feeder) with the power supplied to the customer premises (as measured by the utility meters). Thus, the losses of the power distribution may be measured and determined across each section of the network (e.g., the MV power lines, the LV power lines, and the distribution transformers) to allow the utility to improve the efficiency of the network.

It is to be understood that the foregoing illustrative embodiments have been provided merely for the purpose of explanation and are in no way to be construed as limiting of the invention. Words used herein are words of description and illustration, rather than words of limitation. In addition, the advantages and objectives described herein may not be realized by each and every embodiment practicing the present invention. Further, although the invention has been described herein with reference to particular structure, materials and/or embodiments, the invention is not intended to be limited to the particulars disclosed herein. Rather, the invention extends to all functionally equivalent structures, methods and uses, such as are within the scope of the appended claims. Those skilled in the art, having the benefit of the teachings of this specification, may affect numerous modifications thereto and changes may be made without departing from the scope and spirit of the invention.

What is claimed is:

1. A method, implemented at least in part by a computing device, of determining efficiency of a distribution transformer that receives power from a medium voltage power line and that provides power to a plurality of customer premises via a low voltage subnet, comprising:
   determining an input power to the transformer from the medium voltage power line;
   determining an output power from the transformer;
   determining a transformer efficiency of the transformer based at least in part, by dividing the output power by the input power; and
   providing a notification when the transformer efficiency is below a threshold efficiency.

2. The method of claim 1, wherein said determining the output power comprises measuring a voltage of the low voltage subnet and measuring one or more currents of the low voltage subnet.

3. The method of claim 2, wherein the low voltage subnet includes a low voltage feeder connected to one or more low voltage supply lines, and said determining the output power comprises measuring a voltage of the low voltage feeder and measuring a current of the low voltage feeder.

4. The method of claim 3, wherein said determining the input power comprises measuring a current input to the transformer and estimating a voltage input to the transformer.

5. The method of claim 4, wherein said-estimating the voltage input to the transformer comprises estimating the voltage input based on a measured voltage of the low voltage feeder and a turns ratio of the transformer.

6. The method of claim 1, wherein said determining the input power comprises measuring the current input to the transformer.

7. The method of claim 6, wherein said determining the output power comprises measuring a voltage of the low voltage subnet and said determining the input power further comprises estimating the voltage input to the transformer.

8. The method of claim 7, wherein said estimating the voltage input comprises estimating the voltage input based on the measured voltage of the low voltage subnet and a turns ratio of the transformer.

9. The method of claim 1, wherein the one or more customer premises comprises a plurality of customer premises and said determining the output power comprises:
receiving utility usage data of the plurality of customer premises; and
combining the received utility usage data.

10. The method of claim 9, wherein said determining the input power comprises measuring the current input to the transformer.

11. The method of claim 10, wherein said determining the input power further comprises estimating the voltage input to the transformer based on a measured voltage of the low voltage subnet multiplied by a turns ratio of the transformer.

12. The method of claim 1, wherein said determining a transformer efficiency comprises determining a real power efficiency.

13. The method of claim 1, further comprising using a power factor to determine an amount of real power output from the transformer.

14. The method of claim 1, wherein said steps of determining an input power and determining an output power are performed by a first device co-located with the distribution transformer and said steps of determining a transformer efficiency and providing a notification are performed at computer that is remote from the first device.

15. The method of claim 1, wherein said providing a notification comprises wirelessly transmitting the notification.

16. The method of claim 1, wherein said providing a notification comprises transmitting the notification over a power line.

17. The method of claim 1, wherein said steps of determining an input power, determining an output power, determining a transformer efficiency, and providing a notification are performed by a first device co-located with the distribution transformer.

18. The method of claim 1, further comprising comparing the determined transformer efficiency with a the threshold efficiency.

19. The method of claim 1, wherein said determining the output power comprises measuring a voltage of the low voltage subnet and said determining the input power comprises estimating the voltage input to the transformer based on the voltage of the low voltage subnet.

20. A method, implemented at least in part by a computing device, of determining an efficiency of a distribution transformer that receives power from a medium voltage power line and that provides power to a plurality of customer premises via a low voltage subnet, comprising:
monitoring input power to the transformer from the medium voltage power;
monitoring output power from the transformer to the customer premises;
determining a transformer efficiency based on the input power and the output power;
comparing the transformer efficiency with a threshold efficiency; and
providing a notification when the determined efficiency is below the threshold efficiency.

21. The method of claim 20, further comprising transmitting data of the input power and the output power to a remote device.

22. The method of claim 20, further comprising transmitting data of the input power and the output power to a remote device and wherein said comparing is performed by the remote device.

23. The method of claim 20, wherein said monitoring the output power comprises measuring a voltage of the low voltage subnet and measuring one or more currents of the low voltage subnet.

24. The method of claim 23, wherein said monitoring the input power comprises measuring a current input to the transformer.

25. The method of claim 24, wherein said monitoring the input power further comprises estimating a voltage input based on the measured voltage of the low voltage subnet and a turns ratio of the transformer.

26. The method of claim 20, wherein said monitoring the input power comprises measuring the current input to the transformer.

27. The method of claim 26, wherein said monitoring the input power comprises measuring a voltage of the low voltage subnet and estimating the voltage input to the transformer based on the measured voltage of the low voltage subnet.

28. The method of claim 20, wherein the one or more customer premises comprises a plurality of customer premises and said monitoring the output power comprises:
receiving utility usage data of the plurality of customer premises; and
combining the received utility usage data.

29. The method of claim 28, wherein said monitoring the input power comprises measuring the current input to the transformer.

30. The method of claim 29, wherein said monitoring the input power further comprises estimating the voltage input to the transformer based on a measured voltage of the low voltage subnet.

31. The method of claim 20, wherein said providing a notification comprises wirelessly transmitting the notification.

32. The method of claim 20, wherein said providing a notification comprises transmitting the notification over a power line.

33. A method, implemented at least in part by a computing device, of determining efficiency of an overhead distribution transformer that receives power from a medium voltage power line and that provides power to one or more customer premises via a low voltage subnet, wherein the distribution transformer is connected to the medium voltage power line via a tap conductor at a tap connection node, the method comprising:
determining an output power from the transformer;
measuring one or more power parameters on at least one of:
(a) the tap conductor; and
(b) the medium voltage power line on each side of the connection node;
determining an input power to the transformer based on data of the one or more measured parameters;
determining a transformer efficiency based on the input power and the output power; and
providing a notification when the determined efficiency is below a predetermined threshold.

34. The method of claim 33, further comprising transmitting data of the input power and the output power to a remote device.

35. The method of claim 33, further comprising transmitting data of the input power and the output power to a remote device and wherein said determining a transformer efficiency is performed by the remote device.

36. The method of claim 33, wherein said determining the output power comprises measuring a voltage of the low voltage subnet and measuring one or more currents of the low voltage subnet.

37. The method of claim 36, wherein said determining the input power comprises measuring a voltage of the low voltage subnet and estimating the voltage input to the transformer based on the measured voltage of the low voltage subnet.

38. The method of claim 33, wherein the one or more customer premises comprises a plurality of customer premises and said determining the output power comprises:
  receiving utility usage data of the plurality of customer premises; and
  combining the received utility usage data.

39. The method of claim 33, wherein said providing a notification comprises wirelessly transmitting the notification.

40. The method of claim 33, wherein said providing a notification comprises transmitting the notification over a power line.

41. The method of claim 33, wherein said determining a transformer efficiency based on the input power and the output power comprises, at least in part, dividing the output power by the input power.

42. The method of claim 20, wherein said determining a transformer efficiency based on the input power and the output power comprises, at least in part, dividing the output power by the input power.

43. The method of claim 33, wherein said measuring is performed with a sensor device, the method further comprising:
  wirelessly transmitting the one or more measured power parameters from the sensor device to the computing device; and
  wherein the computing device is co-located with the distribution transformer.

44. The method of claim 1, wherein the distribution transformer is connected to the medium voltage power line via a tap conductor at a tap connection node, and wherein said determining an input power to the transformer from the medium voltage power line comprises:
  obtaining current data by measuring, with a sensor device, the current carried by at least one of:
    (a) the tap conductor; and
    (b) the medium voltage power line on each side of the connection node;
  the method further comprising:
  wirelessly transmitting the current data from the sensor device to the computing device; and
  wherein the computing device is co-located with the distribution transformer.

45. The method of claim 1, wherein the distribution transformer is connected to the medium voltage power line via a tap conductor at a tap connection node, and wherein said monitoring input power to the transformer from the medium voltage power comprises:
  obtaining current data by measuring, with a sensor device, the current carried by at least one of:
    (a) the tap conductor; and
    (b) the medium voltage power line on each side of the connection node;
  the method further comprising:
  wirelessly transmitting the current data from the sensor device to the computing device; and
  wherein the computing device is co-located with the distribution transformer.

* * * * *

UNITED STATES PATENT AND TRADEMARK OFFICE
CERTIFICATE OF CORRECTION

PATENT NO.        : 7,675,427 B2
APPLICATION NO.   : 11/775205
DATED             : March 9, 2010
INVENTOR(S)       : Brian J. Deaver, Sr. et al.

It is certified that error appears in the above-identified patent and that said Letters Patent is hereby corrected as shown below:

In column 5, line 38, delete "802.11a/big," and insert -- 802.11a/b/g, --, therefor.

In column 27, line 15, after "244" insert -- . --.

In column 30, line 59, in Claim 5, delete "said-estimating" and insert -- said estimating --, therefor.

Signed and Sealed this

Eighteenth Day of May, 2010

David J. Kappos
*Director of the United States Patent and Trademark Office*